(12) United States Patent
Sato et al.

(10) Patent No.: US 6,905,982 B2
(45) Date of Patent: Jun. 14, 2005

(54) METHOD OF MANUFACTURING A SEMICONDUCTOR INTEGRATED CIRCUIT DEVICE

(75) Inventors: Hidenori Sato, Ome (JP); Katsuhiko Ichinose, Tokorozawa (JP); Yukino Ishii, Hamura (JP); Tomoko Jinbo, Akishima (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/477,539

(22) PCT Filed: Apr. 19, 2002

(86) PCT No.: PCT/JP02/03945

§ 371 (c)(1),
(2), (4) Date: Nov. 13, 2003

(87) PCT Pub. No.: WO02/093635

PCT Pub. Date: Nov. 21, 2002

(65) Prior Publication Data

US 2004/0097100 A1 May 20, 2004

(30) Foreign Application Priority Data

May 15, 2001 (JP) ......................................... 2001-145222

(51) Int. Cl.[7] .............................................. H01L 21/31
(52) U.S. Cl. ...................... 438/792; 438/791; 118/725; 118/620
(58) Field of Search ......................... 438/792, 778–791; 118/725, 620

(56) References Cited

U.S. PATENT DOCUMENTS

| 4,866,003 | A | 9/1989 | Yokoi et al. |
| 5,780,359 | A | 7/1998 | Brown et al. ............... 438/659 |

(Continued)

FOREIGN PATENT DOCUMENTS

| JP | 63-132434 | 6/1988 |
|---|---|---|
| JP | 7-66139 | 3/1995 |
| JP | 9-181055 | 7/1997 |
| JP | 9-289209 | 11/1997 |
| JP | 10-154703 | 6/1998 |
| JP | 10-154706 | 6/1998 |
| JP | 10-163184 | 6/1998 |
| JP | 10-178004 | 6/1998 |
| JP | 10-189467 | 7/1998 |
| JP | 10-256244 | 9/1998 |
| JP | 11-016999 | 1/1999 |
| JP | 11-017147 | 1/1999 |
| JP | 11-046000 | 2/1999 |
| JP | 11-074097 | 3/1999 |
| JP | 2000-12802 | 1/2000 |
| JP | 2000-058483 | 2/2000 |
| JP | 2000-114257 | 4/2000 |
| JP | 2000-340562 | 12/2000 |
| JP | 2002-050625 | 2/2002 |
| JP | 2002-141350 | 5/2002 |
| JP | 2002-520849 | 7/2002 |
| WO | WO 00/03425 | 1/2000 |

Primary Examiner—Dung A. Le
(74) Attorney, Agent, or Firm—Miles & Stockbridge P.C.

(57) ABSTRACT

A CVD device (100) used for depositing a silicon nitride has a structure in which a hot wall furnace (103) for thermally degrading a source gas and a chamber (101) for forming a film over a surface of a wafer (1) are separated from each other. The hot wall furnace (103) for thermally degrading the source gas is provided above the chamber (101), and a heater (104) capable of setting the inside of the furnace at a high temperature atmosphere of approximately 1200° C. is provided at the outer periphery thereof. The source gas, supplied to the hot wall furnace (103) through pipes (105) and (106), is thermally degraded in this furnace in advance, and degraded components thereof are supplied on a stage (102) of the chamber (101) to form a film on the surface of the wafer (1).

20 Claims, 44 Drawing Sheets

U.S. PATENT DOCUMENTS

| | | | |
|---|---|---|---|
| 5,812,403 A | 9/1998 | Fong et al. | 364/468.28 |
| 5,935,334 A | 8/1999 | Fong et al. | 118/723 |
| 5,994,209 A | 11/1999 | Yieh et al. | 438/541 |
| 6,029,602 A | 2/2000 | Bhatnagar | 118/723 |
| 6,100,579 A | 8/2000 | Sonoda et al. | 257/632 |
| 6,114,216 A | 9/2000 | Yieh et al. | 438/424 |
| 6,121,086 A | 9/2000 | Kuroda et al. | 438/256 |
| 6,413,887 B1 * | 7/2002 | Fukuda et al. | 438/792 |
| 6,454,863 B1 * | 9/2002 | Halpin | 118/725 |

* cited by examiner

METHOD OF MANUFACTURING A SEMICONDUCTOR INTEGRATED CIRCUIT DEVICE

TECHNICAL FILED OF THE INVENTION

The present invention relates to a semiconductor integrated circuit device and its manufacturing technique and, particularly, to a technique effectively applied to a semiconductor integrated circuit device having the step of depositing a silicon nitride on a substrate by using a CVD (Chemical Vapor Deposition) device.

BACKGROUND OF THE INVENTION

In a process of manufacturing a fine and highly integrated LSI in recent years, a difference between the etching rates of a silicon oxide and a silicon nitride is utilized to form a shallow groove isolation (SGI) over a silicon substrate or to form a contact hole for the gate electrode of a MISFET (Metal Insulator Semiconductor Field Effect Transistor) in a self-align manner. A forming method for the shallow groove isolation (SGI) is described in Japanese Patent Laid-Open No 11-16999 and the like, for example. Further, a forming method for a self-align contact (SAC) is described in 11-17147 and the like, for example.

The silicon nitride, used in the forming step of a shallow groove isolation or the forming step of a self-align contact described above, is generally formed by the CVD method using, as a source gas, a silane type gas such as monosilane ($SiH_4$) or the like and ammonia ($NH_3$) or nitrogen ($N_2$). However, it is known that a large amount of hydrogen, derived from the source gas, is taken into this silicon.

A Japanese Patent Laid-open No. 2000-58483 gazette (Mine et al.) points out the problem that when a silicon nitride, serving as a stopper film of a self-align contact, is deposited at an upper portion and a side of a gate electrode containing a p-type polycrystal silicon, boron (B), serving as a dopant in the p-type polycrystal silicon, is diffused into a gate insulator or a silicon substrate, whereby a flat band voltage (Vfb) or a threshold voltage (Vth) is varied and reliability of the gate insulator is degraded. Such problem is caused by the fact that hydrogen, derived from a material gas contained in the silicon nitride, increases diffusion of boron (enhanced diffusion).

This gazette discloses, as a measure for solving the above problem, a technique for suppressing the enhanced diffusion of boron, by depositing a silicon nitride using a source gas without hydrogen and by reducing the concentration of hydrogen in the film to $1 \times 10^{21}$ atoms/cc or less. There is exemplified a mixed gas of a halogen compound of silicon, such as $SiF_4$, $SiCl_4$, $SiBr_4$, and $SiI_4$, and nitrogen, as the source gas without hydrogen.

A Japanese Patent Laid-open NO. 2000-114257 gazette (Matsuoka et al.) points out the problem that since a silicon nitride, deposited by a plasma CVD method using monosilane ($SiH_4$) and nitrogen, has a large amount of hydrogen taken therein, to use this film as a gate insulator cause a harmful influence such as degradation of hot carrier, increase in leak current, or the like. Meanwhile, it also points out the problem that when a halogen compound of silicon such as $SiF_4$ is used instead of monosilane, hydrogen is not taken in the film, but a large amount of halogen is taken therein, which causes trap site increase.

This gazette discloses, as a measure for solving the above problem, a technique for forming a silicon nitride containing a small amount of hydrogen or halogen, by exciting at least one of silicon tetrafluoride ($SiF_2$) and nitrogen and by supplying it to a substrate. As a method for obtaining excited silicon difluoride, there is disclosed a method for electrically exciting silicon tetrafluoride ($SiF_4$) by microwave discharge or for bringing silicon tetrafluoride into contact with a mass of heated Si. Further, as a method for supplying the excited gas to the substrate, there is disclosed a method for, before such two gases are put into a reaction chamber, mixing the gases in a preliminary chamber, which is provided for mixing these gases and is different from the reaction chamber, and thereafter supplying the mixed gases to the reaction chamber.

A Japanese Patent Laid-open No. 11-46000 gazette (Sakamoto) discloses a technique for manufacturing a thin film transistor using polycrystal silicon as a semiconductor region, wherein when a gate insulator and an interlayer insulator are formed over a polycrystal silicon, the gate insulator is made of a silicon oxide and the interlayer insulator is made of a silicon nitride, thereby reducing an overetching amount of the polycrystal silicon in the step of dry-etching the two insulators and of forming a contact hole reaching a thin polycrystal silicon.

Further, this gazette teaches the structure in which the above interlayer insulator is constituted by: an underlying silicon nitride having a high hydrogen containing rate; and an upper silicon nitride having a low hydrogen containing rate. When the hydrogen containing rate of the underlying silicon nitride is increased, a large amount of hydrogen is supplied into the polycrystal silicon and, therefore, crystal faults of the polycrystal silicon are decreased and the transistor characteristics are improved. Meanwhile, when the hydrogen containing rate of the upper silicon nitride is reduced, a fine film having less pin holes in number is obtained and, therefore, a dielectric strength of the transistor is improved.

The above-mentioned two silicon nitrides having the different hydrogen containing rates are continuously deposited by using a plasma CVD device. The underlying silicon nitride having a high hydrogen concentration is deposited by lowering a substrate temperature (250° C.), and the upper silicon nitride having a low hydrogen concentration is deposited by increasing a substrate temperature (390° C.).

A Japanese Patent Laid-open No. 9-289209 gazette (Sonoda et al.) discloses a technique for setting, to $0.6 \times 10^{21}$ atoms/cm$^{-3}$ or less, a bonding amount of Si—H in a silicon nitride used as an interlayer insulator or a passivation film to restrict generation of electron trap in a gate oxide film or a tunnel oxide film and to prevent variation in threshold values of a transistor. The above-mentioned silicon nitride is deposited by a plasma CVD method, which uses a gas having a Si—H bond such as monosilane ($SiH_4$) or dichlorosilane ($Si_2H_6$).

A Japanese Patent Laid-open No. 2000-340562 gazette (Itoh et al.) points out the problem of negative bias temperature instability (NBTI) in which a threshold voltage of a MISFET is varied due to an influence on hydrogen contained in a silicon nitride used for a final protective film (final passivation film) or the like, thereby reducing a lifetime of a device product.

This gazette proposes to use a silicon nitride such that a Si—H bond is employed as a main structure and a Si—$NH_2$ bond is employed as a sub-structure and an integral intensity of the peak of the Si—N bond intensity by a FTIR (Fourier Transform Infrared Spectro-photo) is 1000 times as large as or more than one of the peak of the Si—$NH_2$ bond intensity, as a measure for restricting variation of the device characteristics due to hydrogen in the silicon nitride.

Note that a CVD furnace employing a typical remote plasma is disclosed in, for example, Japanese Patent Application Laid-Open: No. 9-181055 (the corresponding U.S. patent application Ser. No. 08/570,058 filed on Dec. 11, 1995); No. 10-154703 (the corresponding U.S. patent application Ser. No. 08/748,883 filed on Nov. 13, 1996); No. 10-154706 (the corresponding U.S. patent application Ser. No. 08/746,631 filed on Nov. 13, 1996); No. 10-163184 (the corresponding U.S. patent application Ser. No. 08/748,960 filed on Nov. 13, 1996); No. 10-178004 (the corresponding U.S. patent application Ser. No. 08/748,095 filed on Nov. 13, 1996); No. 10-189467 (the corresponding U.S. patent application Ser. No. 08/748,094 filed on Nov. 13, 1996); No. 10-256244 (the corresponding U.S. patent application Ser. No. 08/747,830 filed on Nov. 13, 1996); No. 11-74097 (the corresponding U.S. patent application Ser. No. 08/839,007 filed on Apr. 23, 1997); and the like.

DISCLOSURE OF THE INVENTION

A silicon nitride, used in a forming step of a self-align contact, is deposited by using a butch-type thermal CVD device of a hot wall type, which thermally degrades a silane type gas, such as monosilane ($SiH_4$) or dichlorosilane ($Si_2H_6$), and ammonia gas at a high temperature.

However, in a recent fine MISFET, there begins being adopted, as a measure for preventing a reduction in the threshold values, a so-called dual gate CMOS (or CMIS (Complementary Metal Insulator Semiconductor)) structure in which a gate electrode of an n-channel MISFET is made of n-type polycrystal silicon and a gate electrode of a p-channel MISFET is made of p-type polycrystal silicon and both electrodes are used as a surface channel type.

In this case, there is the danger that, when a thermal treatment at a high temperature is applied in a step after the gate electrode are formed, p-type impurities (boron) in the gate electrode made of p-type polycrystal silicon are diffused into a semiconductor substrate (well) through a gate oxide film and the threshold voltage of the MISFET is varied. Therefore, it is required that a thermal degradation temperature of a source gas is lowered if a silicon nitride is deposited in the step after the gate electrodes are formed.

Further, it is required that pn junctions, constructing a source and drain, are formed in a shallow manner in order to improve operation characteristics of the fine MISFET. However, since when a thermal treatment at a high temperature is applied in a step after the source and drain are formed, impurities in the source and drain areas are diffused and the pn junctions are widened, it is required that a thermal degradation temperature of the source gas is lowered also when the silicon nitride is deposited in the step after the source and drain are formed.

However, since a high temperature of about 800° C. or more is required to completely degrade Si—H bonds in a silane type gas or N—H bonds in an ammonia gas, a large amount of un-degraded Si—H bonds or N—H bonds containing hydrogen is taken into the silicon nitride if the thermal degradation temperature of the source gas is lowered. Therefore, the deterioration of the transistor characteristics as pointed out in the above prior art is caused.

As a measure therefor, it is proposed that a plasma CVD device capable of forming films at a relatively low temperature (about 400° C.) is used to plasma-degrade the source gas without hydrogen in a molecular, whereby the amount of hydrogen contained in the silicon nitride is lowered. Or, it is proposed that a RF power of plasma is increased to completely degrade the silane type gas. However, since when the plasma CVD device method is applied to a step immediately after the gate electrode are formed, the surface of the substrate and the gate insulator are damaged due to the plasma, whereby the deterioration of the transistor characteristics is feared. Further, since the plasma CVD method has lower coverage characteristics of the film as compared with a thermal CVD method, it is difficult to deposit a silicon nitride having a desired thickness in a gap between the fine gate electrodes.

An object of the present invention is to provide a technique capable of, when a silicon nitride is deposited by a thermal CVD method on a semiconductor wafer having a non-dense area and a dense area of a pattern intensity, reducing a film thickness difference between the respective deposited silicon nitride portions on the non-dense area and the dense area of the pattern intensity.

An object of the present invention is to provide a technique capable of forming a silicon nitride containing a small amount of hydrogen without giving heat load to a transistor.

Another object of the present invention is to provide a technique capable of forming a silicon nitride containing a small amount of hydrogen without giving plasma damage to a transistor.

Another object of the present invention is to provide a technique capable of forming a silicon nitride having preferable step coverage without giving heat load and/or plasma damage to a transistor.

The above and other objects and novel features of the present invention will be appear from the description of the specification and the accompanying drawings.

Outlines of the representative ones among the inventions, disclosed in the present application, will be briefly described as follows.

The manufacturing method of a semiconductor integrated circuit devise according to the present invention comprises the steps of:

(a) introducing, to a heat processing unit, a source gas containing a first gas having silicon in a molecular and a second gas having nitrogen in a molecular, and heat-processing said source gas at a temperature equal to or more than respective thermal degradation temperatures of said first and second gases; and (b) supplying, to a film-forming processing unit, a gas containing degradation products of said first and second gases generated in said heat processing unit, and depositing a first insulator, whose a main component is a silicon nitride, over a main surface of a semiconductor wafer maintained at a temperature lower than the thermal degradation temperature of said source gas.

The manufacturing method of a semiconductor integrated circuit device according to the present invention comprises the steps of:

(a) introducing, to a plasma processing unit, a source gas containing a first gas having silicon in a molecular and a second gas having nitrogen in a molecular, and plasma-processing said source gas; and (b) supplying, to a film-forming processing unit, a gas containing degradation products of said first and second gases generated in said plasma processing unit, and depositing a first insulator, whose a main component is a silicon nitride, over a main surface of a semiconductor wafer.

Further, in the manufacturing method of a semiconductor integrated circuit device according to the present invention, a concentration of hydrogen contained in said first silicon nitride is $2 \times 10^{21}$ atoms/cm$^3$ or less, preferably $1 \times 10^{21}$ atoms/cm$^3$ or less, more preferably $0.5 \times 10^{21}$ atoms/cm$^3$ or less.

Note that, in this application, a semiconductor integrated circuit device includes not only one formed especially over a monocrystal silicon substrate but also one formed over another substrate such as a SOI (Silicon On Insulator) substrate or a TFT (Thin Film Transistor) liquid crystal manufacturing substrate except when clearly denoted to the contrary. Further, a wafer means a monocrystal silicon substrate (typically, substantially disk-like shape), a SOI substrate, a glass substrate, another insulator or semi-insulator, a semiconductor substrate, a complex substrate thereof, or the like used for manufacturing a semiconductor integrated circuit device.

Further, in this application, SiN, Si$_3$N$_4$, or silicon nitride means not only stoichiometric one but also ones generally called as the above in semiconductor industry, for example, composition-changed one (that is, nitrogen-rich one or silicon-rich one), or one containing other element such as one containing a large amount of hydrogen, except when clearly denoted to the contrary.

Further, a concentration of hydrogen in a silicon nitride defined according to the present invention means a concentration in measuring, by the FTIR, hydrogen contained in the film immediately after the film forming (as depo).

Further, a NBTI lifetime means a product lifetime calculated from the amount of shift of a threshold voltage per time by remaining the product at a temperature of 85° C. and in a state where negative bias is applied to a gate electrode.

A cold wall type CVD device generally means a CVD device having a system of heating a wafer at temperature higher than the temperature of an inner peripheral wall of a chamber (resistive heating, inductively coupled heating, or lamp heating), wherein a plasma is not directly used.

Further, in the following embodiments, the number of elements or the like (including quantity, numeric value, amount, range, and the like) is not limited to the specific number, but may be more or less than the specific number, except when clearly denoted and when clearly limited to the specific number in principle. Furthermore, in the following embodiments, needless to say, constructing elements (including element steps or the like) are not necessarily indispensable except when clearly denoted and when considered to be clearly indispensable.

Similarly, in the following embodiments, a shape or a positional relationship of the constructing elements or the like includes one substantially closer or similar to the shape except when clearly denoted and when considered to be clearly different. This is applicable to the above numeric value and range.

BEST MODES FOR CARRYING OUT THE INVENTION

Embodiments of the present invention will be below described in detail based on the drawings. Note that, through all the drawings for describing the embodiments, members having the same function are denoted by the same reference symbol and the reciprocation thereof will not be omitted. Additionally, descriptions of the same or similar portions will not be repeated in principle except when being required.

A semiconductor integrated circuit device according to the present embodiment is a DRAM-logic hybrid LSI in which a DRAM (Dynamic Random Access Memory) and a logic circuit are formed over the same semiconductor substrate. A manufacturing method for this LSI will be described in order of step using FIGS. 1 to 30. Note that, in each section view for explaining the manufacturing method, the left and center areas each show a DRAM forming area and the right area shows a logic circuit forming area.

Figure 1:
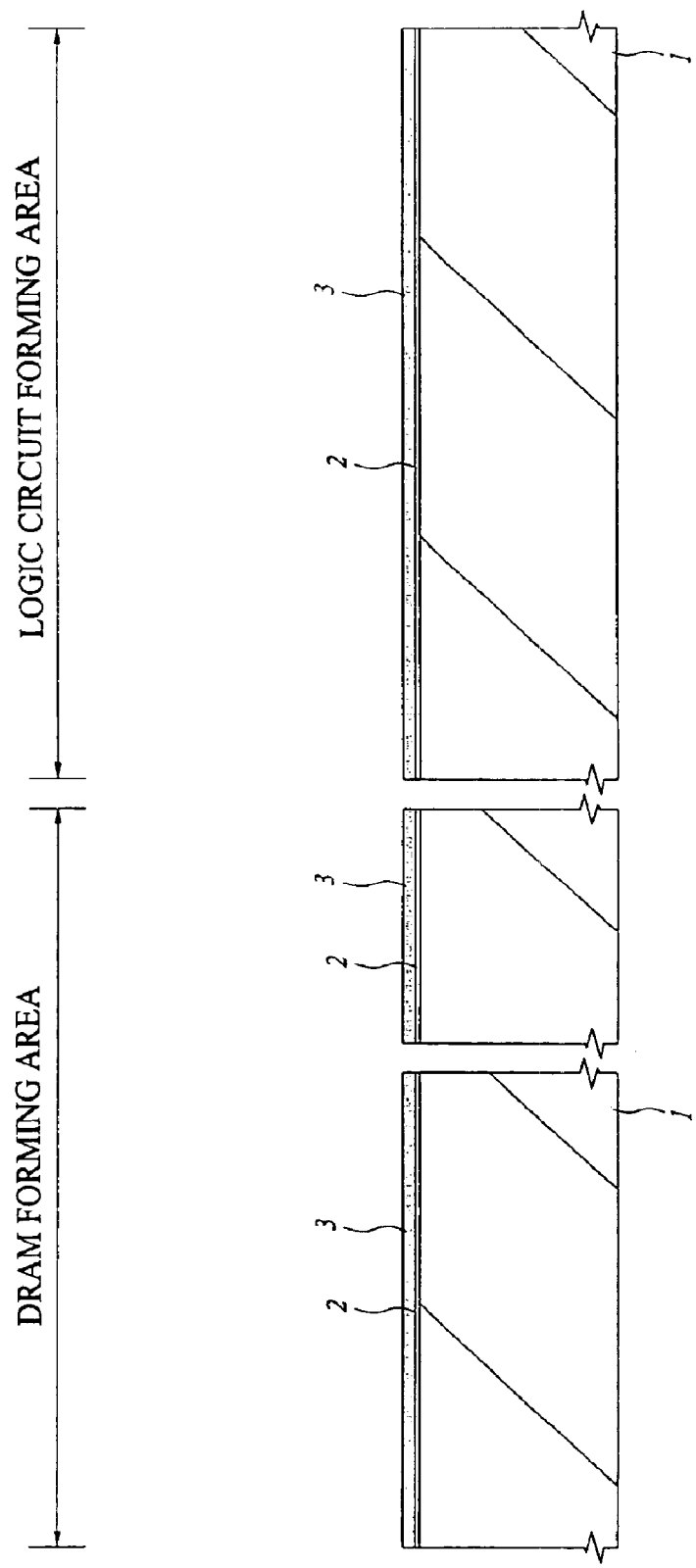
FIG. 1 is a section view of a principal part of a semiconductor substrate showing a manufacturing method for a DRAM-logic hybrid LSI according to one embodiment of the present invention.

At first, as shown in FIG. 1, a semiconductor substrate (hereinafter, referred to as "substrate", and sometimes referred to as "wafer") 1, made of p-type monocrystal silicon having a specific resistance of, for example, about 1 to 10 Ωcm, is thermally oxidized at 800 to 850° C., and a silicon oxide (pad oxide film) 2 for the purpose of stress relaxation and for protection of an active region is formed on a main surface of the substrate 1, and thereafter a silicon nitride 3 is deposited on the silicon oxide 2 by a CVD method.

The above silicon nitride 3 is deposited, by a reduced pressure CVD method (LP-CVD method) using dichlorosilane ($SiH_2Cl_2$) and ammonia ($NH_3$), or monosilane and nitrogen ($N_2$) as a source gas. Further, since the silicon nitride 3 requires a relatively large film thickness (for example, 120 nm), it is desirable that a batch type thermal CVD device having a hot wall furnace is used to simultaneously process, for example, approximately 50 to 100 substrates 1, thereby improving throughput of the film forming. The hot wall type thermal CVD device employs a system of indirectly heating a wafer (radiation heating by a heater outside a tube wall), and has a structure of heating an inner wall of a chamber (reaction chamber) or the entire atmosphere in the chamber to a temperature equal to or more than a degradation temperature of the source gas.

It is desirable that the source gas is thermally degraded at a high temperature of 800° C. or more in depositing the above silicon nitride 3. When the source gas is thermally degraded at a high temperature of 800° C. or more, a Si—H bond and a N—H bond contained in the source gas are substantially completely degraded so that the silicon nitride 3, containing a remarkably small amount of hydrogen, can be obtained. Thus, since the amount of hydrogen diffused from the silicon nitride 3 into the substrate 1 can be remarkably lowered during a thermal treatment performed in the forming step of a shallow groove isolation described later, variations of the device characteristics due to hydrogen remaining in the substrate 1 can be securely suppressed.

Figure 2:
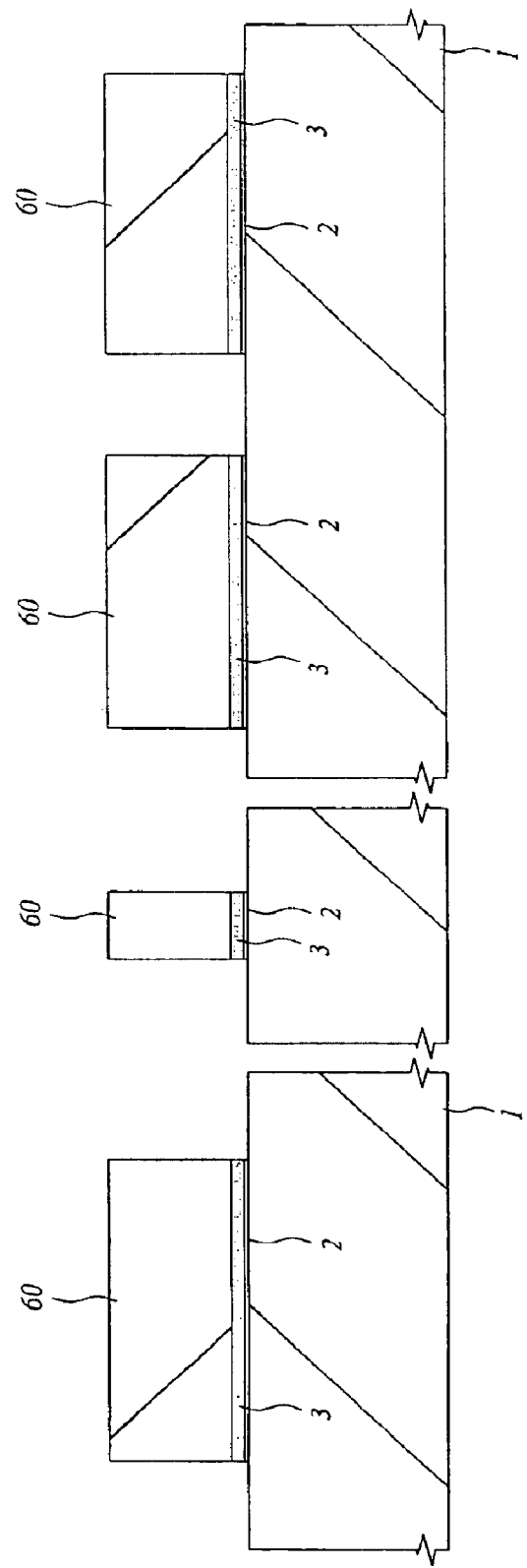
FIG. 2 is a section view of a principal part of a semiconductor substrate showing a manufacturing method for a DRAM-logic hybrid LSI according to one embodiment of the present invention.
Figure 3:
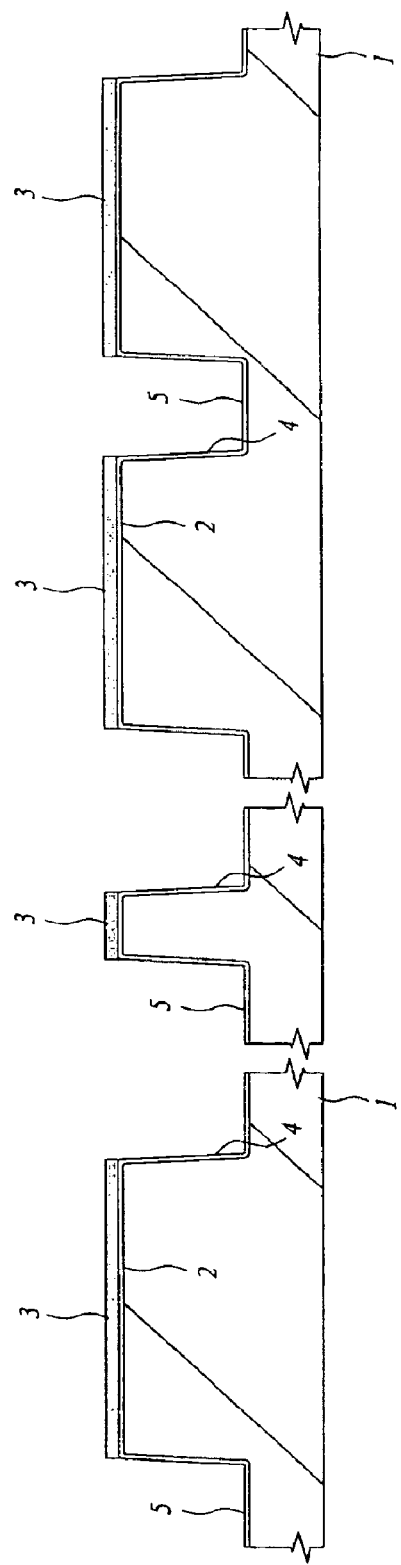
FIG. 3 is a section view of a principal part of a semiconductor substrate showing a manufacturing method for a DRAM-logic hybrid LSI according to one embodiment of the present invention.

Next, as shown in FIG. 2, the silicon nitride 3 and the silicon oxide 2 in a device isolation region are removed, by dry-etching using a photoresist film 60 as a mask. Subsequently, after the photoresist film 60 is removed, as shown in FIG. 3, a shallow groove isolation 4 is formed at a depth of about 350 nm on the substrate 1 in the device isolation area, by dry-etching using the silicon nitride 3 as a mask, and then the substrate 1 is thermally oxidized at approximately 950° C. to form a silicon oxide 5 at an inner wall of the shallow groove isolation 4. The silicon oxide 5 is formed, for recovering etching damages occurring at the inner wall of the shallow groove isolation 4 and for relaxing a stress of the silicon oxide 5 embedded inside the shallow groove isolation 4 in the next step.

Figure 4:
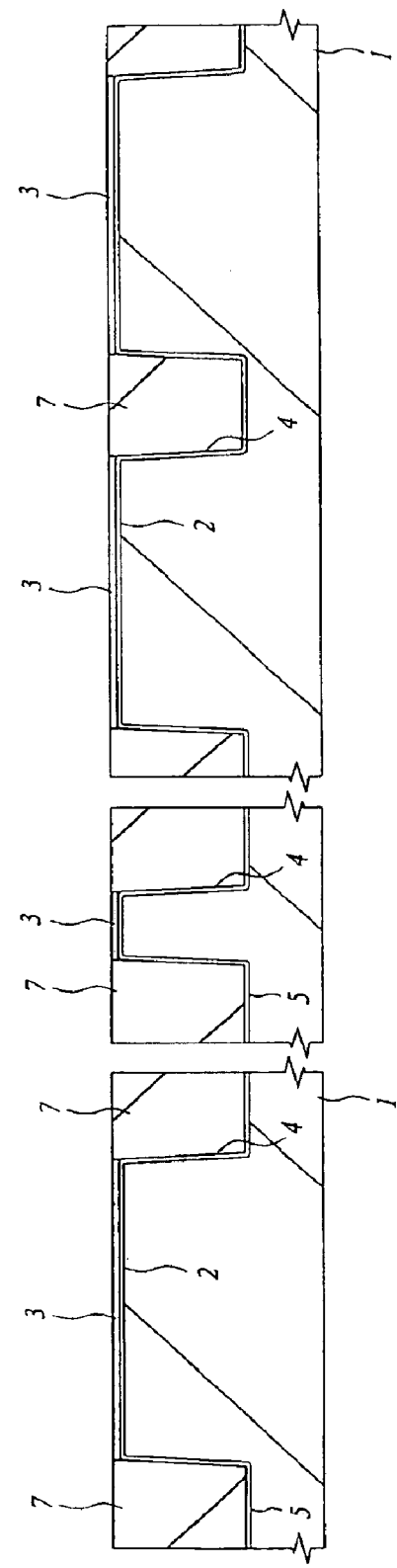
FIG. 4 is a section view of a principal part of a semiconductor substrate showing a manufacturing method for a DRAM-logic hybrid LSI according to one embodiment of the present invention.
Figure 5:
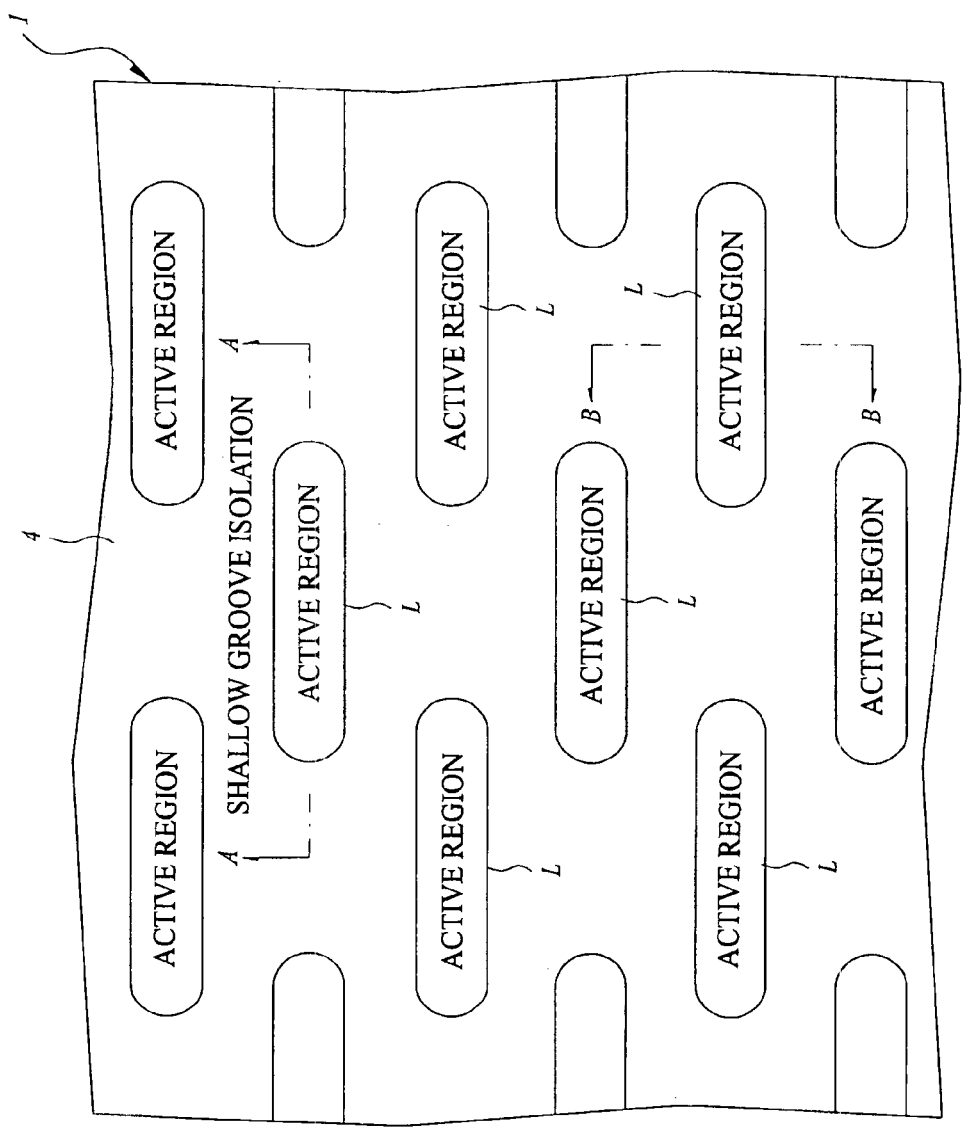
FIG. 5 is a plane view of a principal part of a semiconductor substrate showing a manufacturing method for a DRAM-logic hybrid LSI according to one embodiment of the present invention.

Next, as shown in FIG. 4, after a silicon oxide 7 is deposited over a main surface of the substrate 1 by the CVD method and then the substrate 1 is thermally processed at approximately 1000° C. to improve film quality of the silicon oxide 7, a chemical mechanical polishing (CMP) method is used to polish the silicon oxide 7 and to flatten the surface thereof. In this polishing, the above silicon nitride 3 is used as a stopper and the silicon oxide 7 is left only inside the shallow groove isolation 4. Through the steps so far, the shallow groove isolation 4 is completed on the main surface of the substrate 1. As shown in FIG. 5, the above shallow groove isolation 4 are formed, whereby a large number of active regions L, having elongated island-like patterns surrounded by the shallow groove isolation 4, is formed on the substrate 1 in the DRAM forming area. Note that the left area of FIG. 4 (and each section view for explaining the manufacturing method) is a section taken along the line A—A of FIG. 5, and the center area thereof is a section taken along the line B—B.

Figure 6:
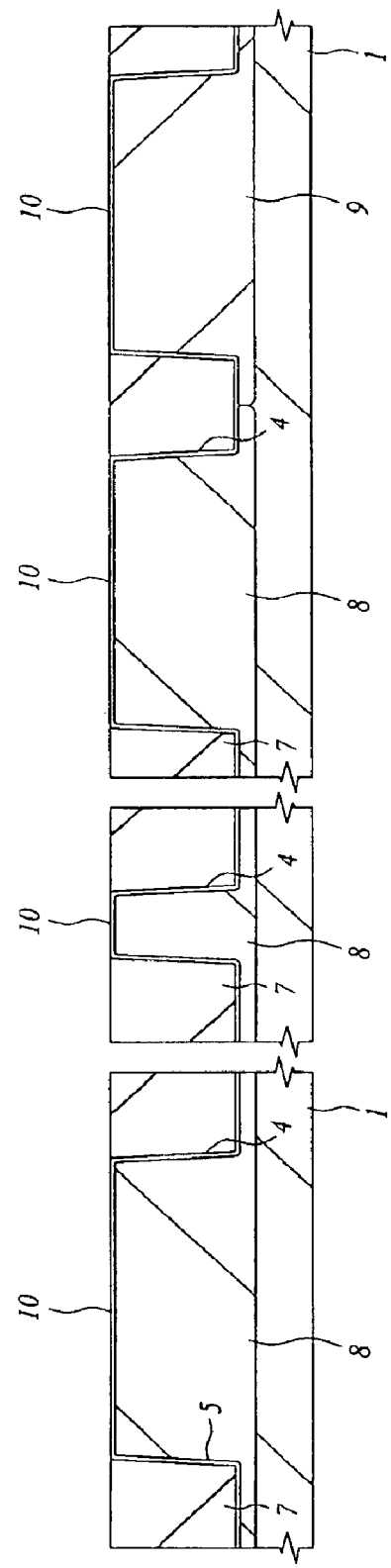
FIG. 6 is a section view of a principal part of a semiconductor substrate showing a manufacturing method for a DRAM-logic hybrid LSI according to one embodiment of the present invention.

Next, after the silicon nitride 3, remaining over the main surface of the substrate 1, is removed by heat phosphoric acid, as shown in FIG. 6, B (boron) is ion-implanted into parts of the substrate 1 to form a p-type well 8 and P (phosphorus) is ion-implanted into other parts thereof to form an n-type well 9. Subsequently, after the silicon oxide 2 remaining on the surface of the substrate 1 is removed by hydrofluoric acid, the substrate 1 is wet-oxidized at approximately 850° C. to form a gate insulator 10, made of a clean silicon oxide having a thickness of approximately 6 nm, on a surface of the p-type well 8 and a surface of the n-type well 9. The gate insulator 10 may be made of a silicon oxynitride, a silicon nitride, a complex insulator of a silicon oxide and a silicon nitride, or the like, instead of the silicon oxide.

Figure 7:
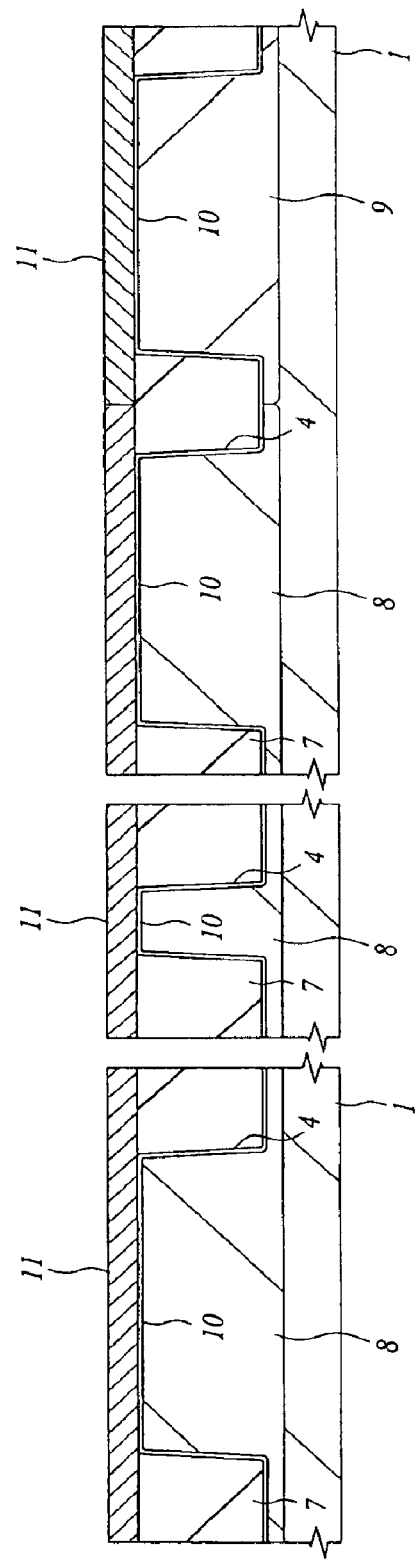
FIG. 7 is a section view of a principal part of a semiconductor substrate showing a manufacturing method for a DRAM-logic hybrid LSI according to one embodiment of the present invention.

Next, as shown in FIG. 7, after a polycrystal silicon 11 having a thickness of approximately 70 nm is deposited at an upper portion of the gate insulator 10 by the CVD method, a photoresist film (not shown) is used as a mask to ion-implant P (phosphorus) into the polycrystal silicon 11 located at an upper portion of the p-type well 8 and to ion-implant B (boron) into the polycrystal silicon film 11 located at an upper portion of the n-type well 9. Thus, a conductive type of the polycrystal silicon 11 is an n-type on the p-type well 8 and a p-type on the n-type well 9. This ion-implanting is performed so that an n-channel MISFET and a p-channel MISFET constructing the logic circuit become surface channel types, respectively.

Figure 8:
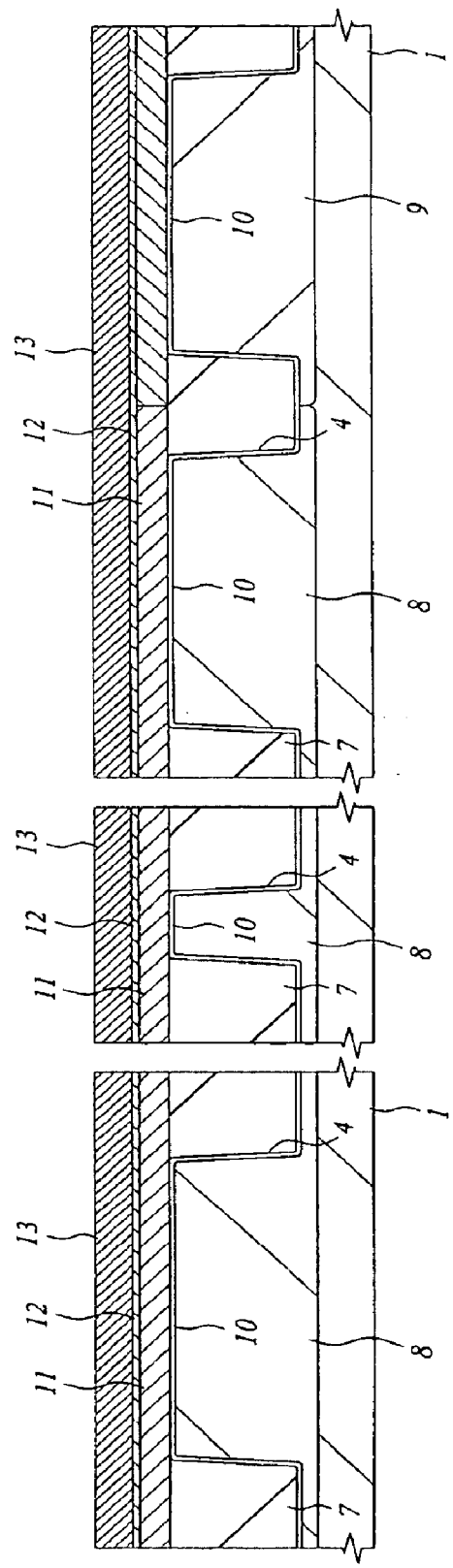
FIG. 8 is a section view of a principal part of a semiconductor substrate showing a manufacturing method for a DRAM-logic hybrid LSI according to one embodiment of the present invention.

Next, after a surface of the polycrystal silicon 11 is cleansed by hydrofluoric acid, as shown in FIG. 8, an approximately 7 nm thick $WN_x$ film 12 and an approximately 70 nm thick W film are continuously deposited on the polycrystal silicon 11 by a sputtering method. The $WN_x$ film 12 functions as a barrier layer for preventing the polycrystal silicon 11 and the W film 13 from reacting to each other in the step of thermally processing the substrate 1. Note that a Mo (molybdenum) film may be deposited at an upper portion of the $WN_x$ film 12 instead of the W film 13. Further, a silicon film containing approximately 5% to 50% of Ge (germanium) may be used instead of the polycrystal silicon 11. When the silicon film contains Ge therein, it is advantageous that a contact resistance with the upper $WN_x$ film 12 can be reduced because a band gap of silicon is narrowed and/or solid solubility of impurities is increased. In order to contain Ge in silicon, there is a method of depositing a silicon film containing Ge, by the CVD method using monosilane ($SiH_4$) and $GeH_4$, in addition to the method of ion-implanting Ge into a silicon film.

Figure 9:
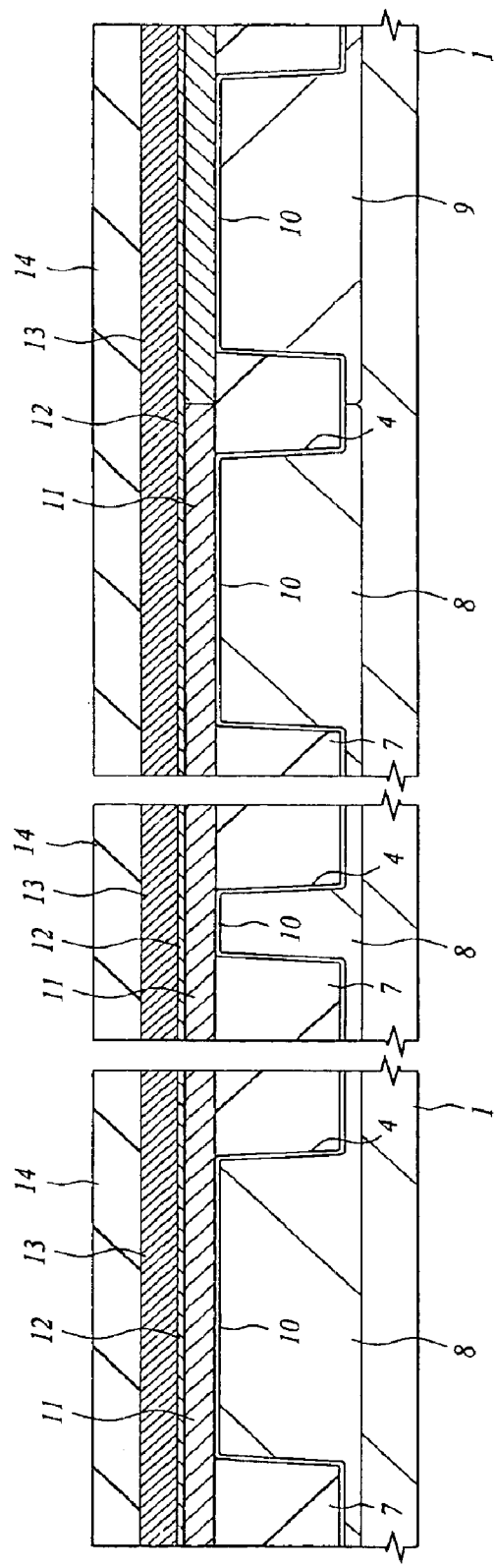
FIG. 9 is a section view of a principal part of a semiconductor substrate showing a manufacturing method for a DRAM-logic hybrid LSI according to one embodiment of the present invention.

Next, as shown in FIG. 9, a silicon nitride 14 having a thickness of approximately 160 nm is deposited on the W film 13 by the CVD method. This silicon nitride 14 is used as a cap insulator, which covers upper surfaces of gate electrodes formed in the later step. In the present embodiment, this silicon nitride 14 is deposited by using the following device.

Figure 10:
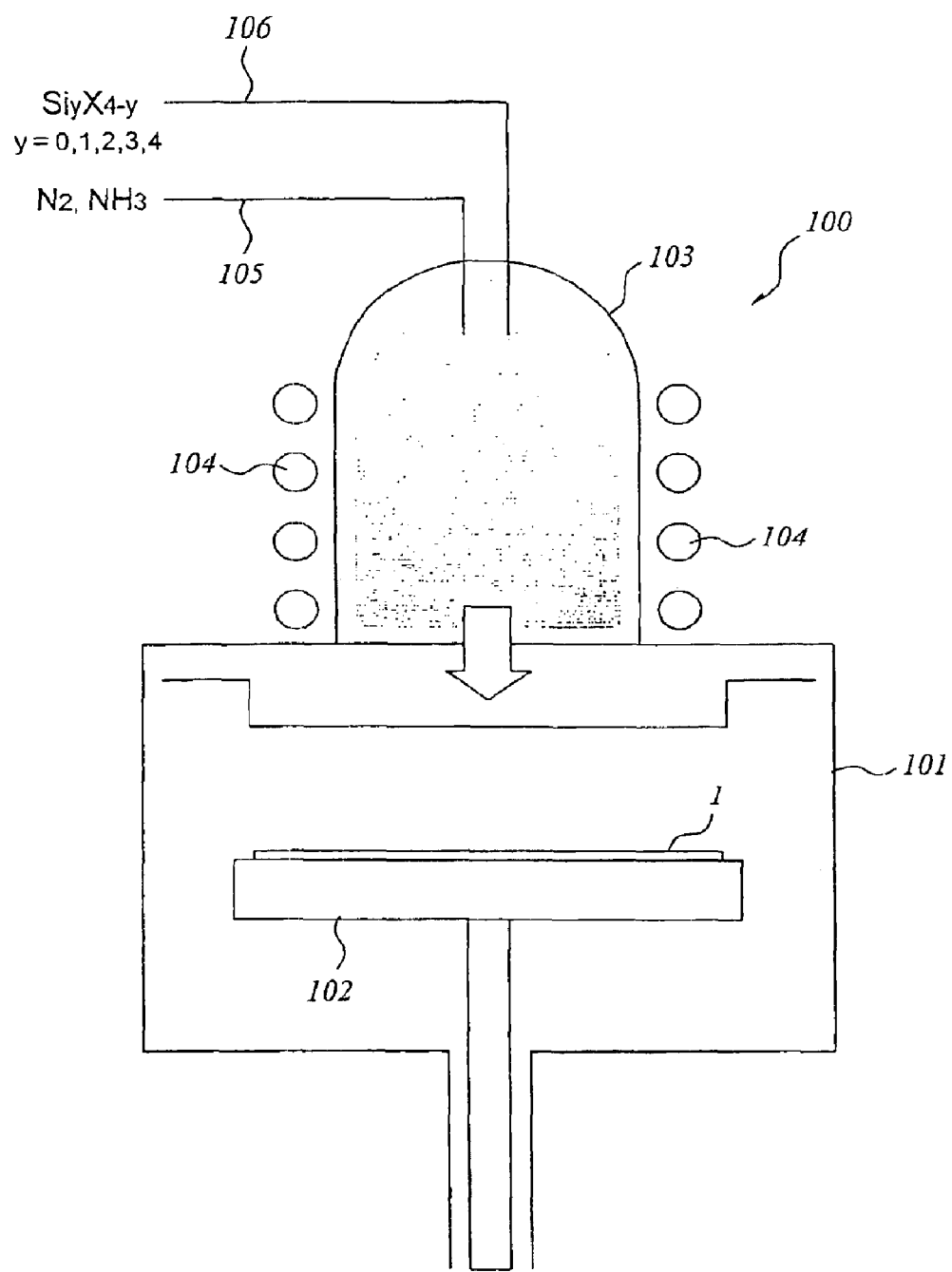
FIG. 10 is a schematic diagram showing a principal part of a CVD device used in one embodiment of the present invention.

FIG. 10 is a schematic diagram showing a principal part of a CVD device 100 used to deposit the silicon nitride 14. A stage 102 for mounting the wafer (substrate) 1 thereon is provided at the center of a chamber 101 of this CVD device 100. A heater (not shown) for heating the wafer 1 at a desired temperature is incorporated in this stage 102. In other words, the chamber 101 of this CVD device 100 does not have a hot wall structure of heating the entire inside thereof at a uniform temperature but a cold wall structure of heating only the wafer 1 on the stage 102. In the cold wall type chamber 101, since the thermally degraded components of the source gas are hardly deposited on the inner wall thereof, the film forming with high throughput can be performed. Further, since the chamber 101 of this CVD device 100 adopts a single wafer system of mounting the wafer 1 one by one on the stage 102 to perform the film forming, the temperature of the wafer 1 can be set with high precision and the film thickness uniformity within the wafer surface is preferable as compared with the butch type thermal CVD device.

Note that since the latest single wafer system silicon nitride CVD furnace and a method therefor are disclosed in Japanese Patent Application No. 2000-332863 (filed on Oct. 31, 2000) and No. 2000-232191 (filed on Jul. 31, 2000) and the like by the present inventors, the descriptions thereof will not be repeated here.

A hot wall furnace 103 for thermally degrading a source gas is provided above the chamber 101. The hot wall furnace 103 is made of a heat-resistant material such as quartz or the like, and a heater 104 capable of setting the inside of the furnace to a high temperature atmosphere of approximately 1200° C. at maximum is provided at a periphery thereof. A source gas, supplied to the hot wall furnace 103 through pipes 105 and 106, is thermally degraded in this furnace in advance, and the degraded components thereof are supplied on the stage 102 of the chamber 101 to form a film on the surface of the wafer 1. The source gas is, for example, dichlorosilane ($SiH_2Cl_2$) and ammonia ($NH_3$).

As described above, since the above CVD device 100 is constructed so that the hot wall furnace (heat processing unit) 103 for thermally degrading the source gas and the chamber (film-forming processing unit) 101 for forming a film on the surface of the wafer 1 are separated from each other, the degradation temperature of the source gas and the temperature of the wafer 1 can be independently controlled.

Figure 11:
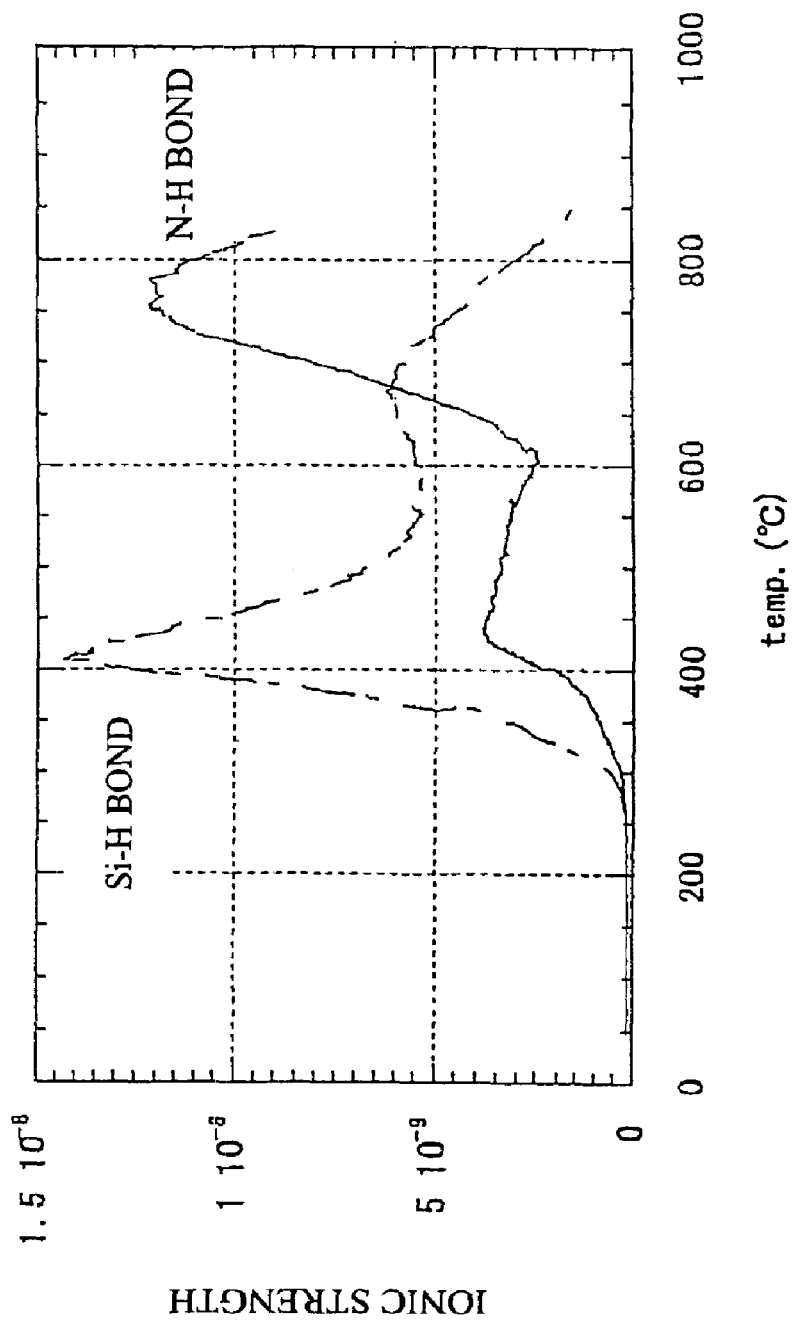
FIG. 11 is a graph showing results where desorption behavior of hydrogen in a silicon nitride, deposited by using a commercially available reduced pressure CVD device, is evaluated by using a thermal desorption spectrometry (TDS).

FIG. 11 is a graph showing results obtained by using a thermal desorption spectrometry (TDS) method to evaluate desorption behavior of hydrogen in a silicon nitride, which is deposited by using a source gas of dichlorosilane ($SiH_2Cl_2$) and ammonia ($NH_3$) and a source gas of monosilane ($SiH_4$) and nitrogen ($N_2$) and by employing a commercially available reduced pressure CVD device. A horizontal axis indicates the degradation temperature of the source gas and a vertical axis indicates the ionic strength of hydrogen in the film.

As illustrated, the peaks of desorption of hydrogen are confirmed near 400° C. and near 750° C. to 800° C. Since the hydrogen in the silicon nitride is considered to be present as a Si—H bond and a N—H bond and the Si—H bond is smaller than the N—H bond in bond energy, it is assumed that the desorption near 400° C. is caused by the Si—H bond and that near 750° C. to 800° C. is caused by the N—H bond.

From this measurement results, the temperature of the heater 104 in thermally degrading the source gas in the hot wall furnace 103 of the above CVD device 100 should have a lower limit near 600° C. at which the desorption of the N—H bond is promoted. More intermediate products containing the H—N bond are produced below the temperature, which is not practical. In order to reduce the produced amount of intermediate products containing the N—H bond, the temperature of the heater 104 is preferably set at 700° C. or more, and more preferably 800° C or more, whereby the Si—H bond and the N—H bond are substantially completely degraded.

Meanwhile, since the chamber 101, serving as the film-forming processing unit, is separated from the hot wall furnace 103, the temperature of the stage 102 mounting the wafer 1 thereon can be lowered to a room temperature or less even when the temperature of the heater 104 is set at 800° C. or more. Further, since the chamber 101 has the cold wall structure of heating only the wafer 1 on the stage 102, the reduction of throughput in the film forming is small even if the temperature of the stage 102 is set to the low temperature.

A practical lower limit temperature of the stage 102 during the film forming is in the vicinity of 0° C. However, there is the danger that the throughput in the film forming is reduced when the temperature of the stage 102 is too low, or that intermediate products of the source gas, generated in the hot wall furnace 103, are cooled in the mid-course of reaching the surface of the wafer 1 to generate impurities. Therefore, the practical lower limit temperature should be preferably set at 400° C. or more. The upper limit temperature of the stage 102 is the upper limit of the temperature, which is allowed from the viewpoint of the characteristics of a device formed over the main surface of the wafer 1, and since it is different depending on the device, it cannot be generally defined. However, in the case of the DRAM hybrid LSI according to the present embodiment, for example, the temperature is 700° C. to 750° C. When the temperature of the stage 102 exceeds this upper limit temperature, there is the danger that B (boron) in the polycrystal silicon 11 is diffused into the n-type well 9 and the threshold voltage of the p-channel MISFET partially constructing the logic circuit is varied.

Further, the pressure of the source gas should be set to at least 0.013 kPa (0.1 Torr) or more. However, the pressure in the vicinity of 45.5 kPa (350 Torr) is generally preferable in consideration of the throughput in the film forming. Meanwhile, an upper limit of the gas pressure is preferably set at 98.8 kPa (760 Torr) or less in consideration of safety of the source gas.

The source gas, used for forming the silicon nitride 14, is not limited to a combination of dichlorosilane ($SiH_2Cl_2$) and ammonia ($NH_3$) described above, and may use a well-known source gas, which is used for forming a silicon nitride using the reduced pressure CVD (LP-CVD) device, for example, a combination of a silicon compound generally indicated by $SiH_yX_{(4-y)}$ (X is halogen such as F, Cl, Br, and I, and y is 0, 1, 2, 3, or 4), such as $SiH_4$ or $Si_2H_6$, and of $NH_3$, $N_2H_4$ or $N_2$, or the like.

By using a source gas containing no hydrogen in a molecular among the above silicon compounds, for example, by using a combination of a silicon compound, such as $SiF_4$, $SiCl_4$, $Si_2Cl_6$, $SiBr_4$, and $SiI_4$, and of $N_2$, the concentration of hydrogen in the silicon nitride can be further reduced. When such silicon compound is used, the step coverage is slightly reduced as compared with the case where the source gas containing hydrogen in a molecular is used. However, since the silicon nitride 14 is deposited on a surface of a flat base, no problem occurs.

Thus, since the source gas can be thermally degraded at a high temperature of 800° C. or more by using the above CVD device 100, the silicon nitride 14 having a remarkably low concentration of hydrogen in the film can be obtained. Further, the temperature of the wafer (substrate) 1 during the film forming can be set at the low temperature, thereby allowing variation in the device characteristics due to heat load to be securely restricted.

Figure 12:
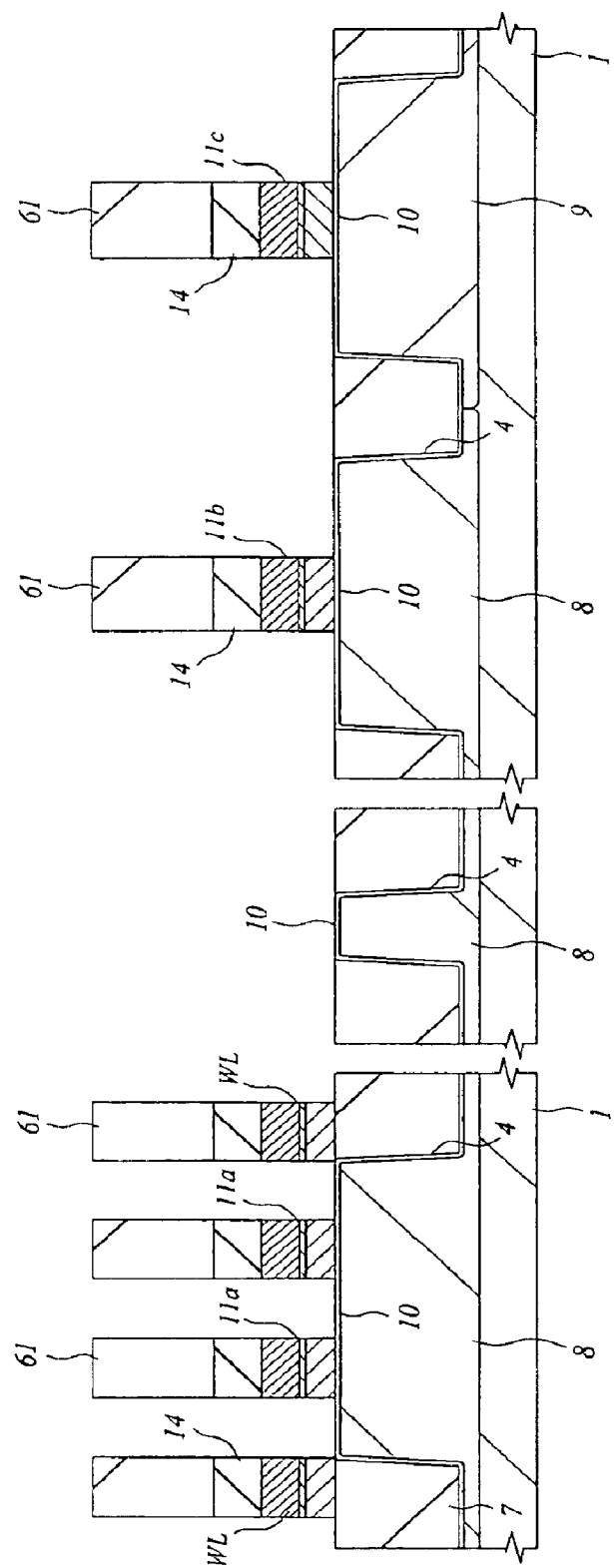
FIG. 12 is a section view of a principal part of a semiconductor substrate showing a manufacturing method for a DRAM-logic hybrid LSI according to one embodiment of the present invention.
Figure 13:
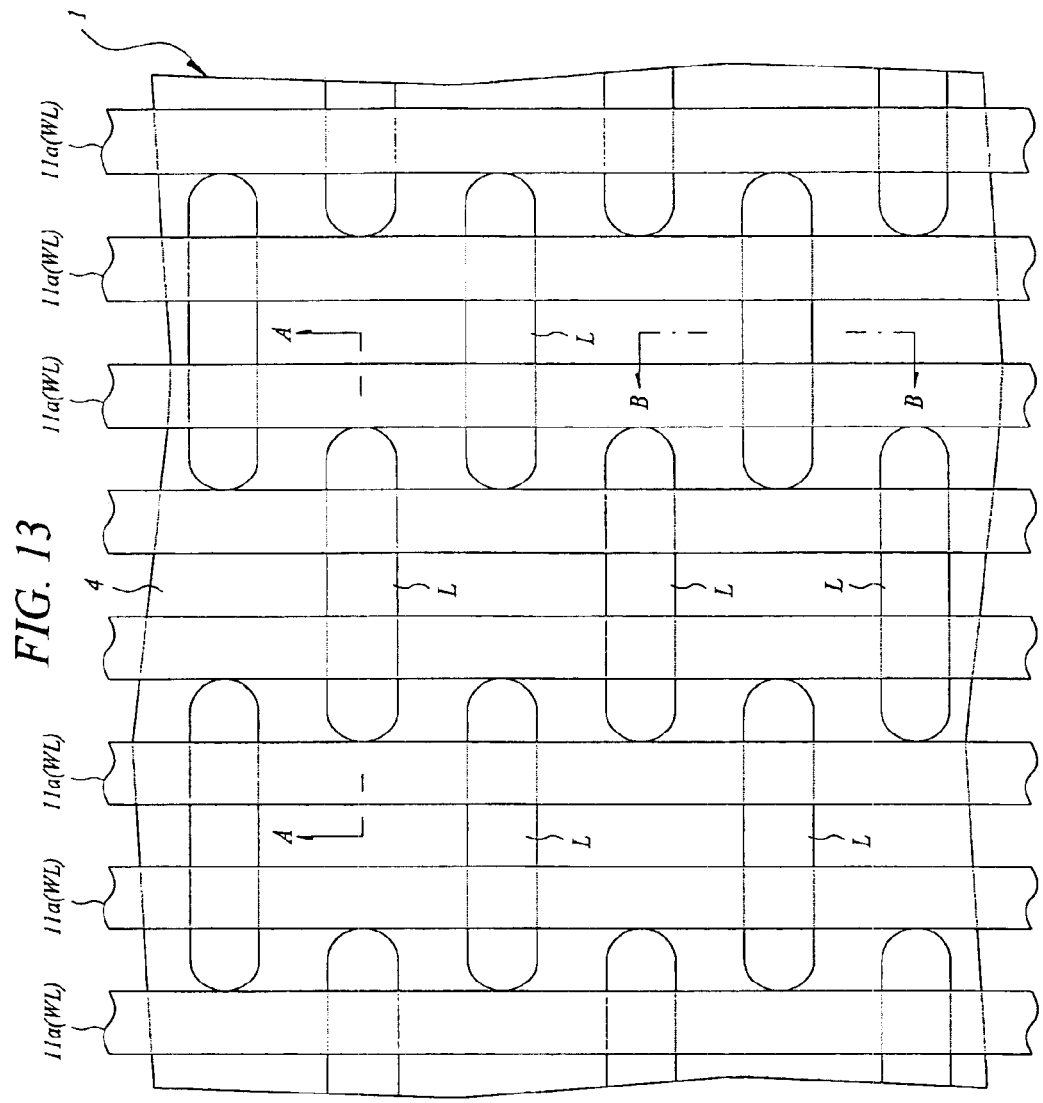
FIG. 13 is a plane view of a principal part of a semiconductor substrate showing a manufacturing method for a DRAM-logic hybrid LSI according to one embodiment of the present invention.

Next, as shown in FIG. 12, a photoresist film 61 is used as a mask to sequentially dry-etch the silicon nitride 14, the W film 13, the $WN_x$ film 12, and the polycrystal silicon 11, whereby gate electrodes 11a (word lines WL) are formed over the gate insulator 10 in the DRAM forming area and gate electrodes 11b and 11c are formed over the gate insulator 10 in the logic circuit forming area. The gate electrodes 11a to 11c each have the polymetal structure where the $WN_x$ film 12 and the W film 13 are laminated at the upper portion of the polycrystal silicon 11. As shown in FIG. 13, the gate electrodes 11a in the DRAM forming area extend in a direction orthogonal to long sides of the active regions L, and construct the word lines WL in the region other than the active regions L. A gate length of each gate electrode 11a and an interval between the adjacent electrodes 11a are, for example, 0.13 to 1.4 μm.

Figure 14:
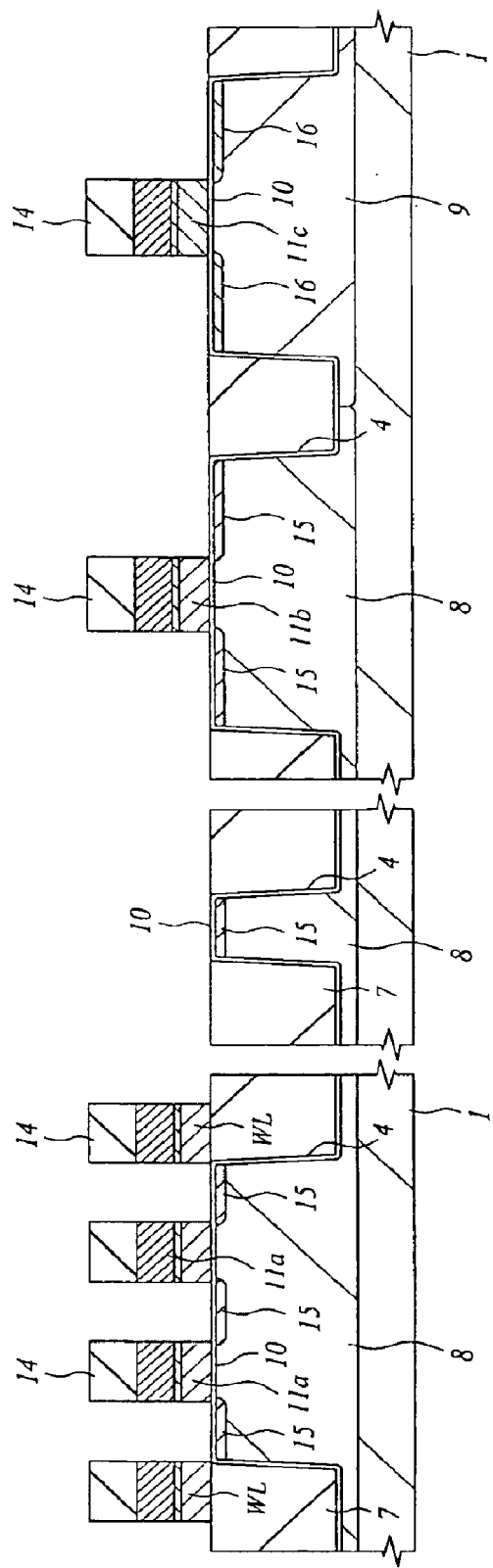
FIG. 14 is a section view of a principal part of a semiconductor substrate showing a manufacturing method for a DRAM-logic hybrid LSI according to one embodiment of the present invention.

Next, after the photoresist film 61 is removed, as shown in FIG. 14, As (arsenic) is ion-implanted into the p-type well 8 by using a photoresist film (not shown) as a mask and B (boron) is ion-implanted into the n-type well 9, whereby n⁻-type semiconductor regions 15 are formed in the p-type wells 8 and at both sides of each of the gate electrodes 11a and 11b and p⁻-type semiconductor regions 16 are formed in the n-type well 9 and at both sides of the gate electrode 11c.

Figure 15:
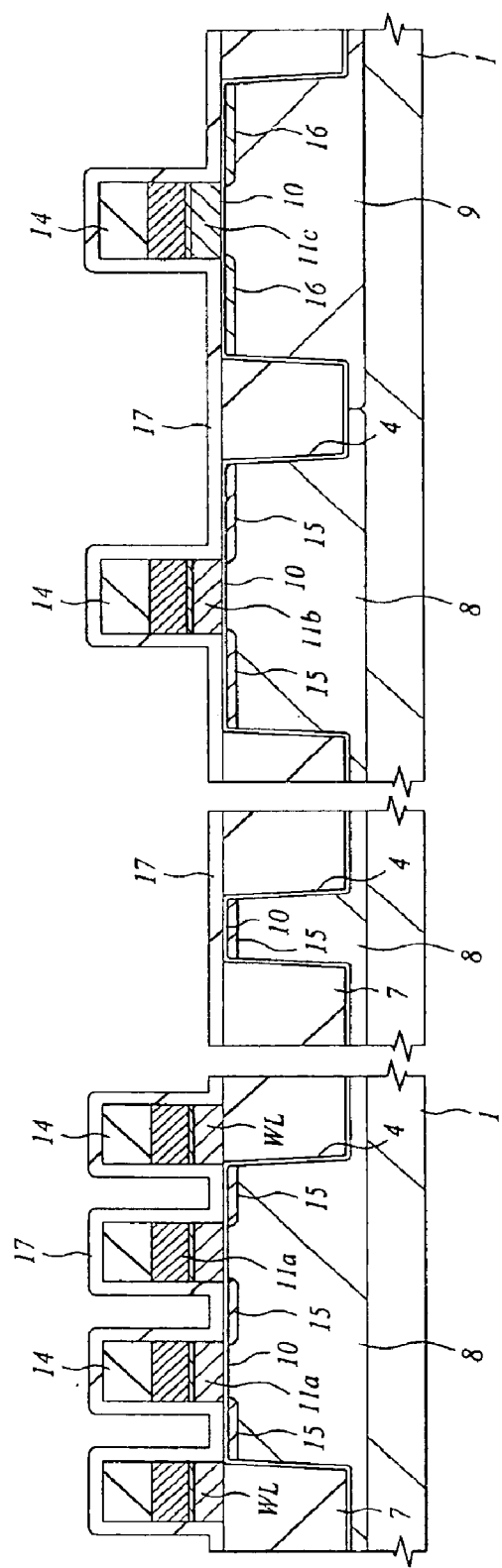
FIG. 15 is a section view of a principal part of a semiconductor substrate showing a manufacturing method for a DRAM-logic hybrid LSI according to one embodiment of the present invention.

Next, as shown in FIG. 15, an approximately 50 nm thick silicon nitride 17, covering the upper portions and the sidewalls of the gate electrodes 11a, 11b, and 11c, is deposited. This silicon nitride 17 is deposited by using the CVD device 100 used for depositing the above silicon nitride 14, and the film-forming conditions (temperatures of the heater 104 and the stage 102, and type and pressure of the source gas) are set to be identical to the film-forming conditions of the silicon nitride 14. Thus, the silicon nitride 17, having a remarkably low concentration of hydrogen in the film, can be obtained similarly to the above silicon nitride film 14, and the variation of the device characteristics due to heat load can be securely restricted.

Figure 16:
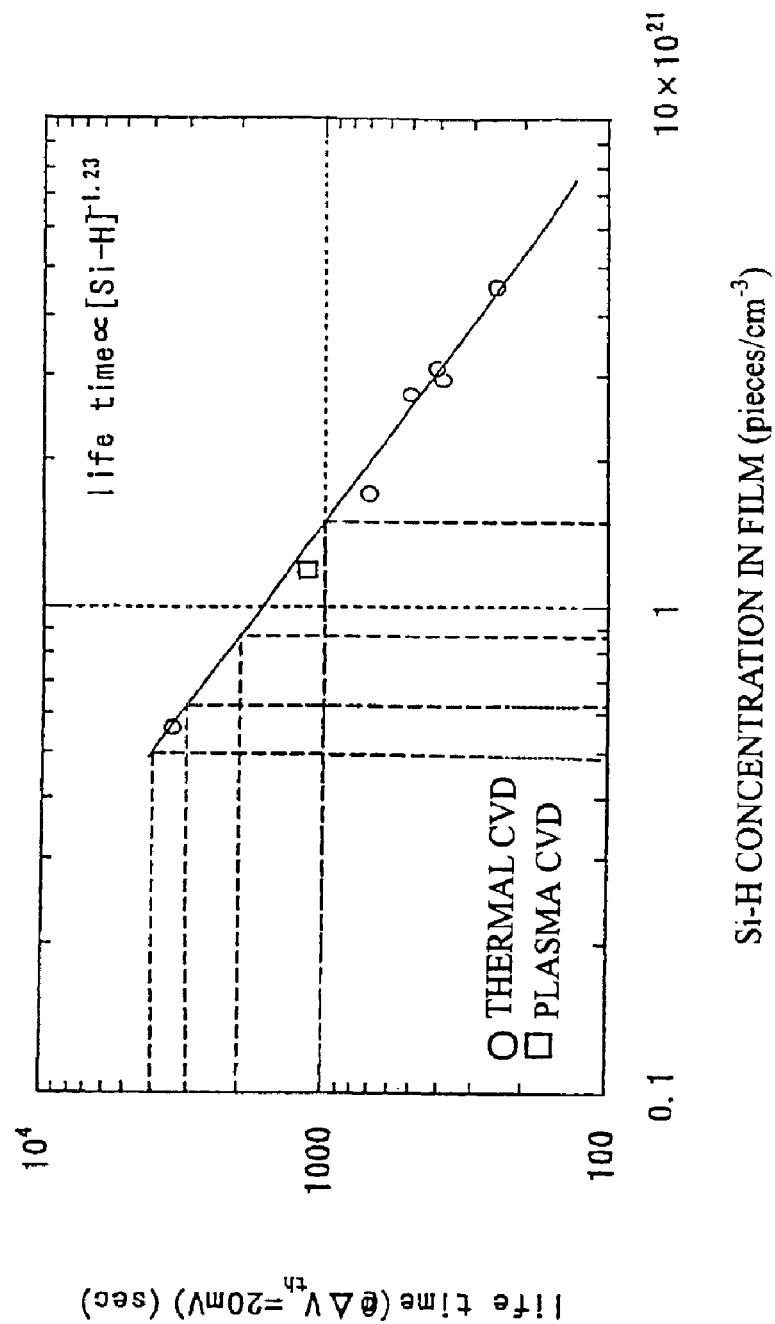
FIG. 16 is a graph showing results where a relationship between a Si—H bond concentration and a NBTI lifetime in a silicon nitride covering an upper portion and a sidewall of a gate electrode is evaluated.

FIG. 16 is a graph showing results obtained by evaluating a relationship between a Si—H bond concentration and a NBTI lifetime (time when a threshold voltage is shifted by 20 mV), in the silicon nitride covering the upper portions and the sidewalls of the gate electrodes. The silicon nitride is deposited by using monosilane ($SiH_4$) and ammonia ($NH_3$) as a source gas and by using a commercially available reduced pressure CVD device, and the Si—H bond concentration in the film is measured by using a Fourier transform infrared spectrophotometer (FTIR). Further, a silicon nitride, deposited by using monosilane ($SiH_4$) and nitrogen ($N_2$) as a source gas and by using the commercially available plasma CVD device, is also subjected to similar evaluation.

As a result, it has been found that the NBTI lifetime correlates with the Si—H bond concentration in the silicon nitride and is reduced in proportion to the Si—H bond concentration to the 1.2th power. From this fact, in the case of the above silicon nitride 14 covering the upper portions of the gate electrodes 11a, 11b, and 11c or the silicon nitride 17 covering the sidewalls thereof, the concentration of hydrogen immediately after the film forming is set at $2\times10^{21}$ atoms/cm³ or less, preferably $1\times10^{21}$ atoms/cm³ or less, and more preferably $0.5\times10^{21}$ atoms/cm³ or less, thereby securely improving the NBTI lifetime of the device.

Figure 17:
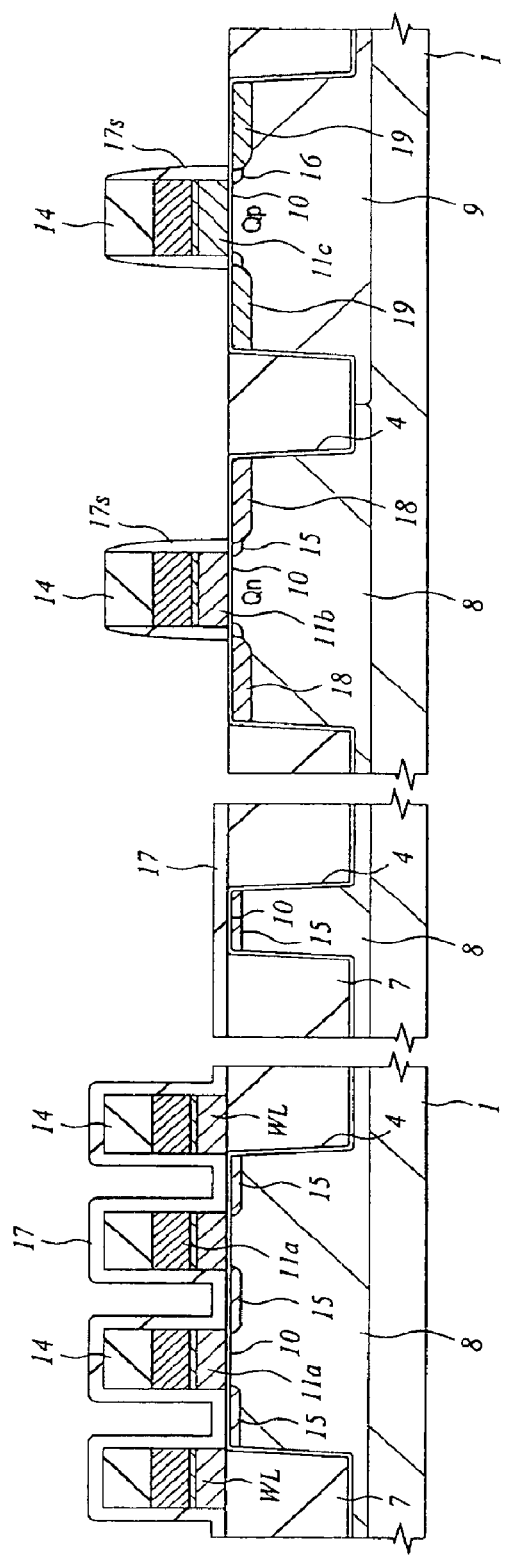
FIG. 17 is a section view of a principal part of a semiconductor substrate showing a manufacturing method for a DRAM-logic hybrid LSI according to one embodiment of the present invention.

Next, as shown in FIG. 17, the substrate 1 in the DRAM forming area is covered with a photoresist film (not shown) and the silicon nitride 17 in the circuit unit is anisotropically etched, whereby sidewall spacers (sidewall insulators) 17s are formed at the sidewalls of the gate electrodes 11b and 11c in the logic circuit forming area. Subsequently, a photoresist film (not shown) is used as a mask to ion-implant As (arsenic) into the p-type well 8 in the logic circuit forming area and to ion-implant B (boron) into the n-type well 9, whereby n⁺-type semiconductor regions (source and drain) 18 are formed in the p-type well 8 at both sides of each of the gate electrodes 11a and 11b and p⁺-type semiconductor regions (source and drain) 19 are formed in the n-type well 9 at both sides of the gate electrode 11c. Through the steps so far, an n-channel MISFET Qn and a p-channel MISFET Qp constructing the logic circuit are completed.

Figure 18:
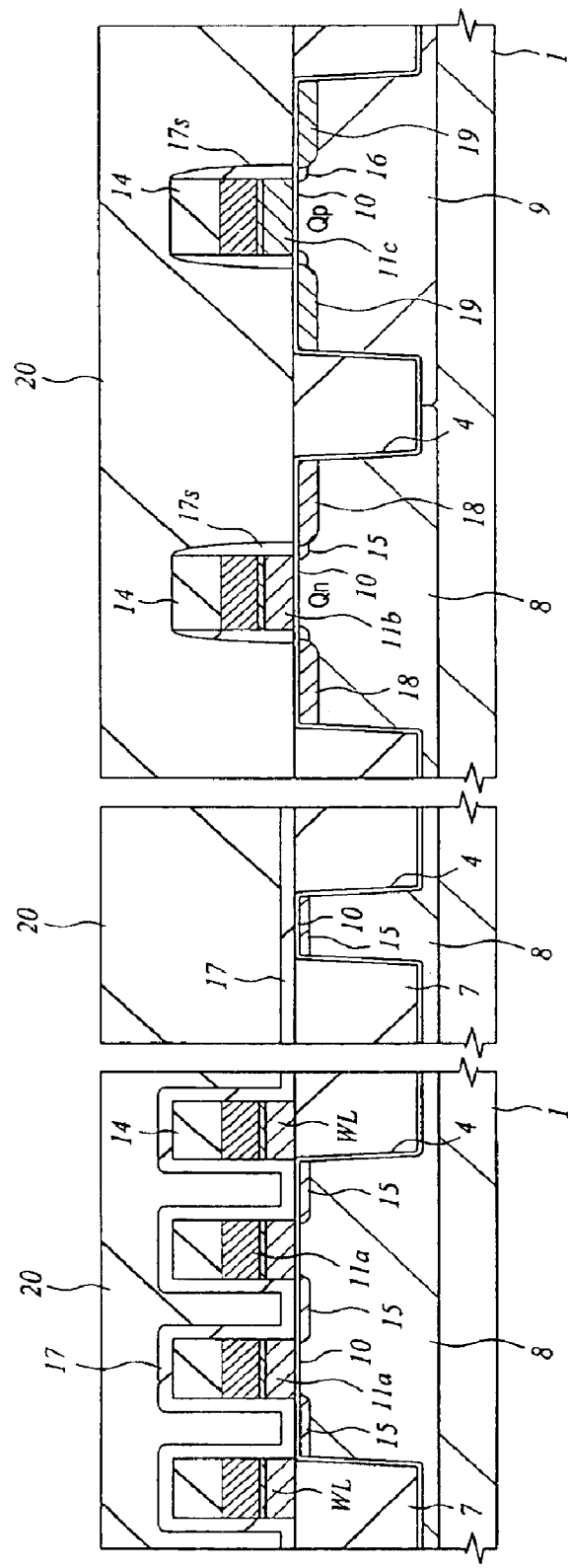
FIG. 18 is a section view of a principal part of a semiconductor substrate showing a manufacturing method for a DRAM-logic hybrid LSI according to one embodiment of the present invention.

Next, as shown in FIG. 18, an interlayer insulator 20, made of, for example, a spin-on-glass and a double-layered silicon oxide, is formed over the upper portions of the gate electrodes 11a to 11c. In order to form the interlayer insulator 20, the spin-on-glass is first spin-applied on the upper portions of the gate electrodes 11a to 11c. Since the spin-on-glass is excellent in gap fill characteristics between fine wirings as compared with a silicon oxide deposited by the CVD method, even if the interval between the gate electrodes 11a (word lines WL) in the DRAM forming area is remarkably narrow, the interval can be preferably embedded. Next, after a silicon oxide is deposited on the spin-on-glass by the CVD method, this silicon oxide is polished and flattened by the chemical mechanical polishing method. Next, a second-layer silicon oxide is deposited on the polished and flattered silicon oxide by the CVD method in order to correct fine damages (micro-scratches) on the surface of the silicon oxide having occurred in being polished by the chemical mechanical polishing method.

Figure 19:
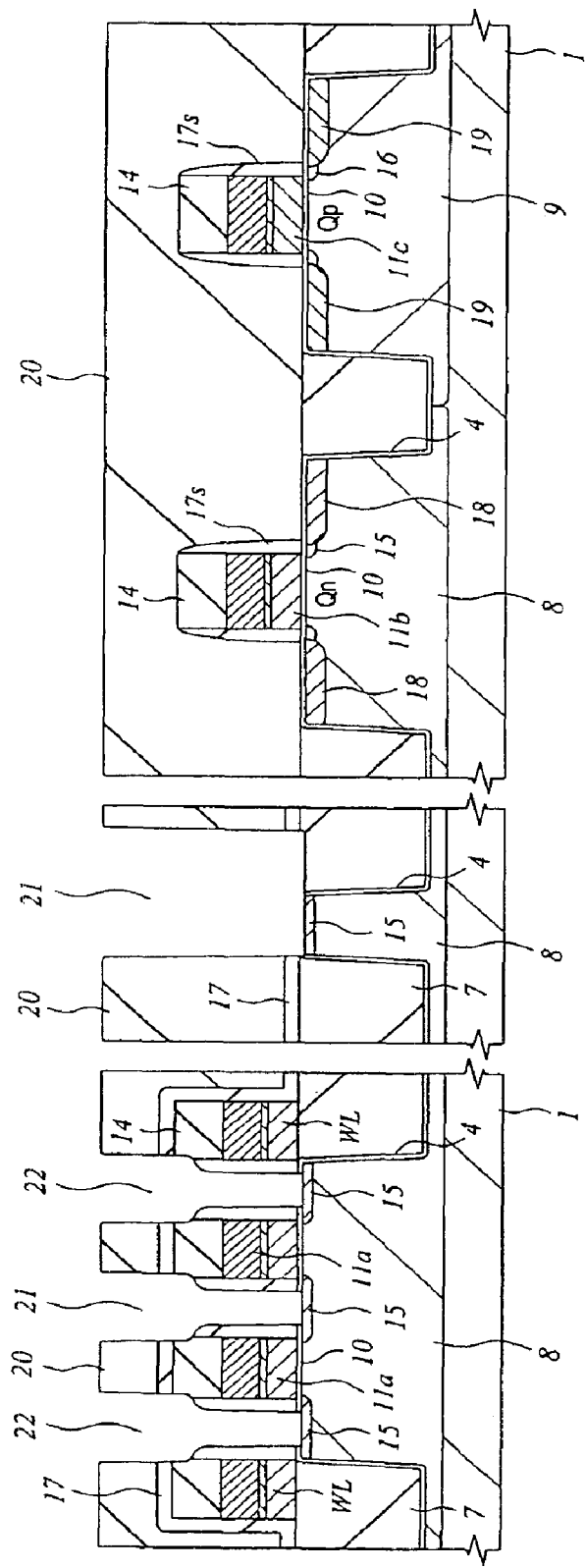
FIG. 19 is a section view of a principal part of a semiconductor substrate showing a manufacturing method for a DRAM-logic hybrid LSI according to one embodiment of the present invention.
Figure 20:
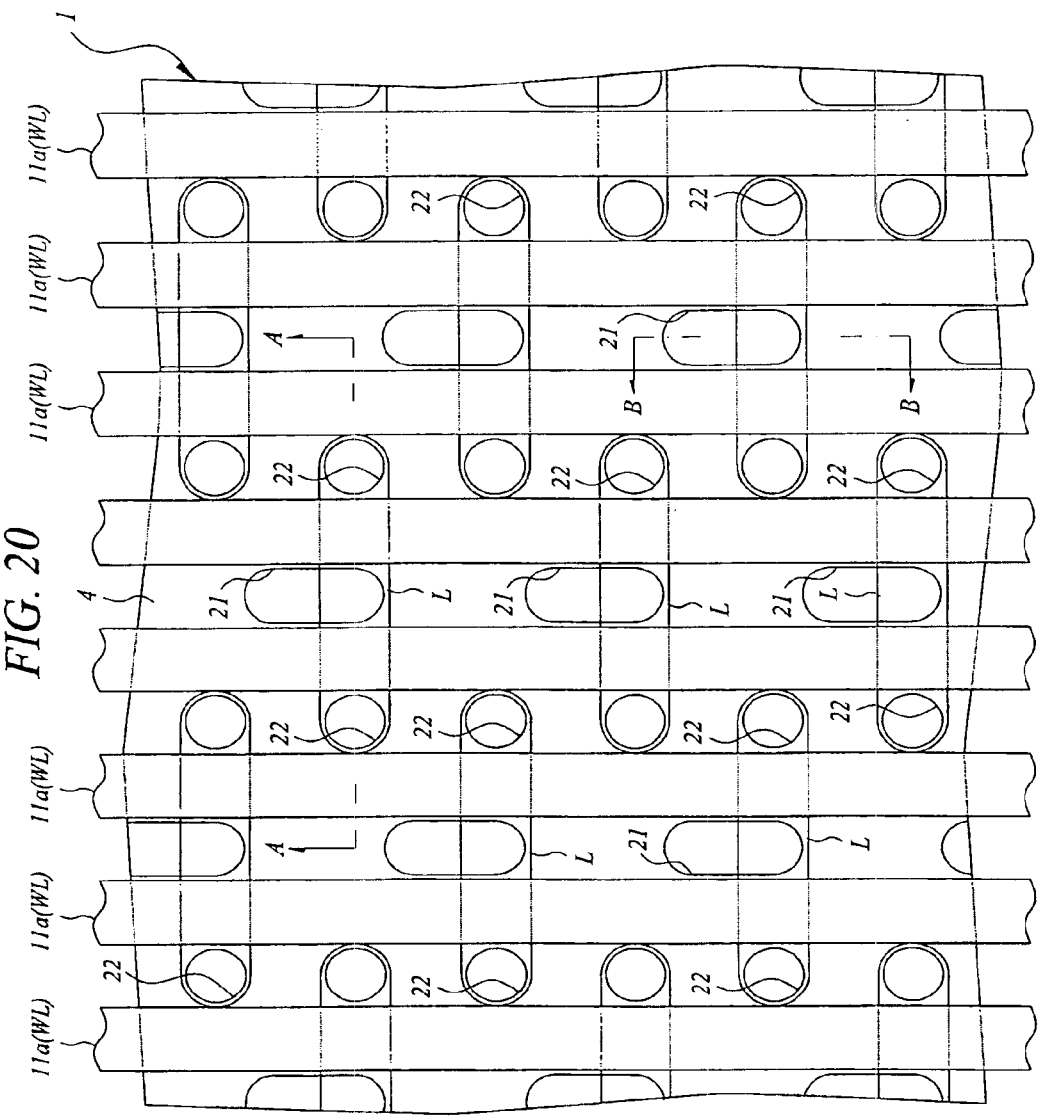
FIG. 20 is a plane view of a principal part of a semiconductor substrate showing a manufacturing method for a DRAM-logic hybrid LSI according to one embodiment of the present invention.

Next, as shown in FIGS. 19 and 20, an interlayer insulator 20 at the upper portions of the n⁻-type semiconductor regions 15 and in the DRAM forming area is removed by dry-etching using a photoresist film (not shown) as a mask. This etching is performed under the condition that the etching rate of the interlayer insulator 20 (the spin-on-glass and the silicon oxide) to the silicon nitrides 14 and 17 is made larger.

Subsequently, the silicon nitride 17 on the n⁻-type semiconductor regions 15 is removed by dry-etching using the photoresist film as a mask and the surfaces of the n⁻-type semiconductor regions 15 are exposed, whereby contact holes 21 and 22 are formed. A part of the contact hole 21 extends on the shallow groove isolation 4 off the active region L.

The etching of the above silicon nitride film 17 is performed under the condition that the etching rate of the silicon nitride 17 to the silicon oxide 7 embedded in the shallow groove isolation 4 is made larger so that the shallow groove isolation 4 is not deeply grinded. Further, this etching is performed under the condition that the silicon nitride 17 is anisotropically etched so that the silicon nitride 17 is left at the sidewalls of the gate electrodes 11a (word lines WL). Thus, the contact holes 21 and 22, each having a fine diameter, are formed for the gate electrodes 11a (word lines WL) in a self-align manner.

Figure 21:
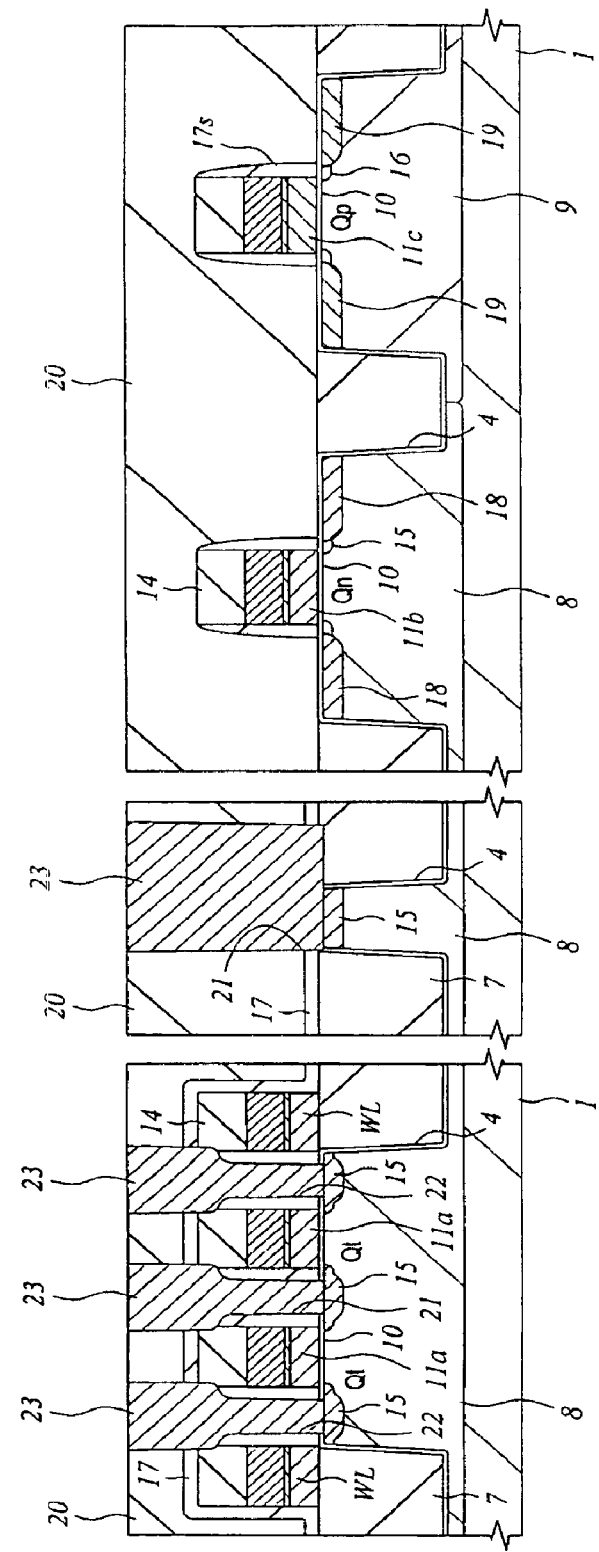
FIG. 21 is a section view of a principal part of a semiconductor substrate showing a manufacturing method for a DRAM-logic hybrid LSI according to one embodiment of the present invention.

Next, as shown in FIG. 21, plugs 23 are formed inside the contact holes 21 and 22. In order to form the plugs 23, a low-resistant polycrystal silicon, in which P is doped, is deposited, by the CVD method, inside the contact holes 21 and 22 and at the upper portion of the interlayer insulator 20 and, subsequently, an unnecessary polycrystal silicon on the interlayer insulator 20 is removed by dry-etching.

Next, the substrate 1 is thermally processed in the nitrogen gas atmosphere and P in the polycrystal silicon constructing the plugs 23 is diffused into the $n^-$-type semiconductor regions 15, whereby the low-resistance source and drain is formed. Through the steps so far, a memory cell selection MISFETQt is formed in the DRAM forming area.

Figure 22:
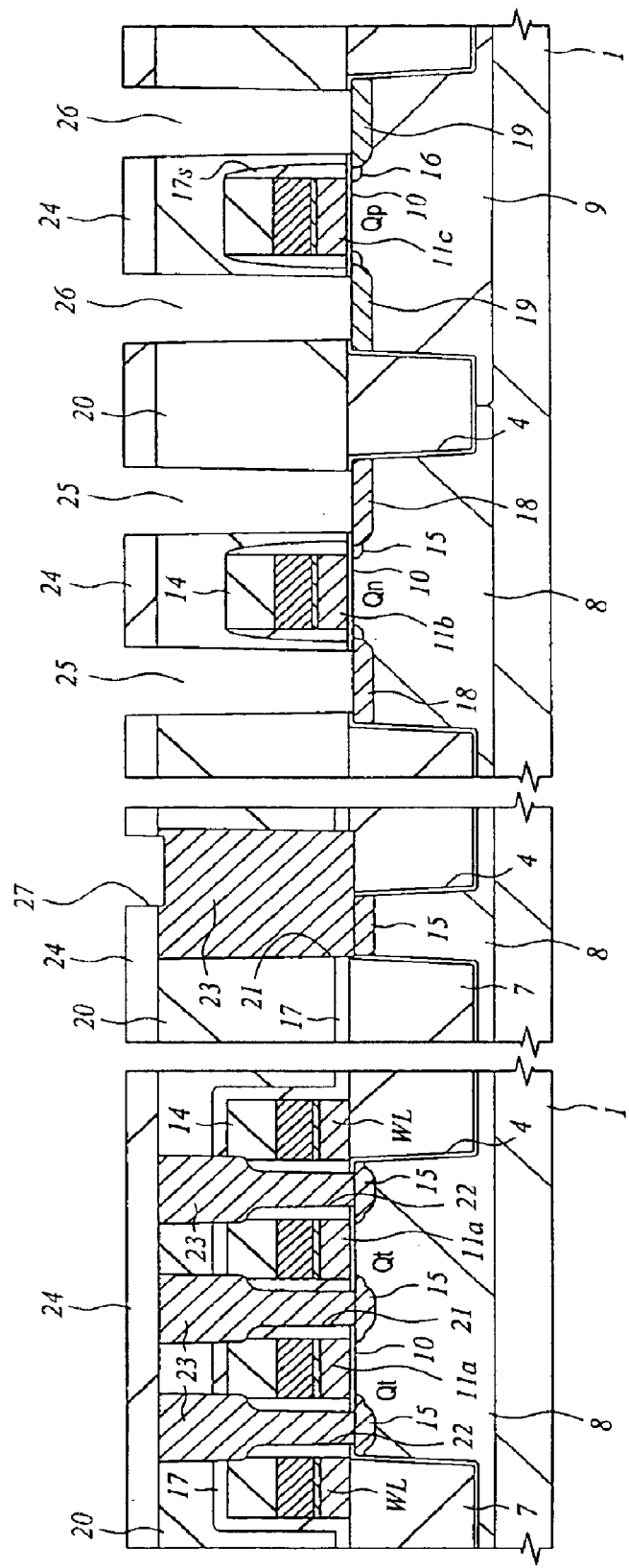
FIG. 22 is a section view of a principal part of a semiconductor substrate showing a manufacturing method for a DRAM-logic hybrid LSI according to one embodiment of the present invention.
Figure 23:
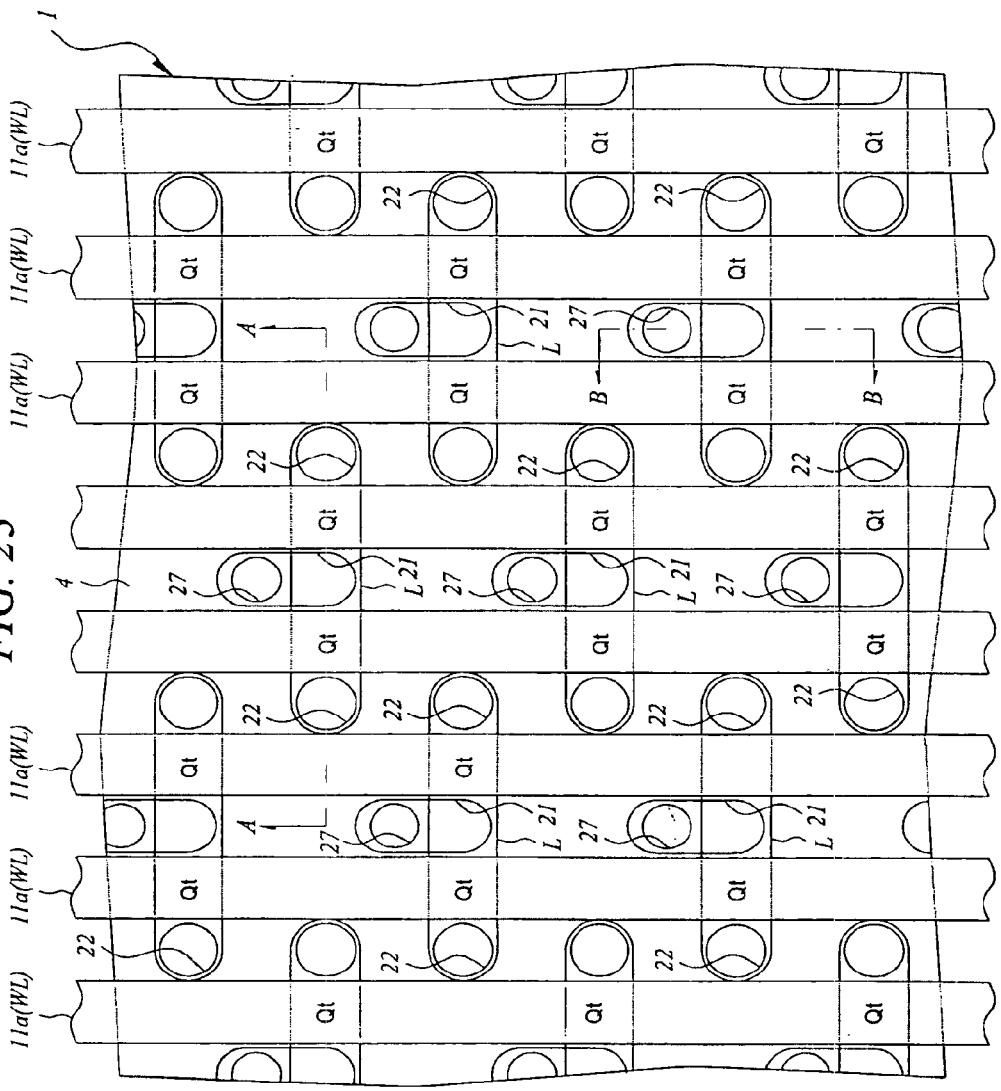
FIG. 23 is a plane view of a principal part of a semiconductor substrate showing a manufacturing method for a DRAM-logic hybrid LSI according to one embodiment of the present invention.

Next, as shown in FIGS. 22 and 23, after a silicon oxide 24 is deposited at the upper portion of the interlayer insulator 20 by the CVD method, the silicon oxide 24 in the logic circuit forming area and the underlying interlayer insulator 20 below the same are dry-etched by dry-etching using a photoresist film (not shown) as a mask, whereby contact holes 25 are formed on the source and drain ($n^+$-type semiconductor regions 18) of the n-channel MISFET Qn and contact holes 26 are formed on the source and drain ($p^+$-type semiconductor regions 13) of the p-channel MISFET Qp. Further, the silicon oxide 24 in the DRAM forming area is etched to form through holes 27 on the contact holes 21.

Figure 24:
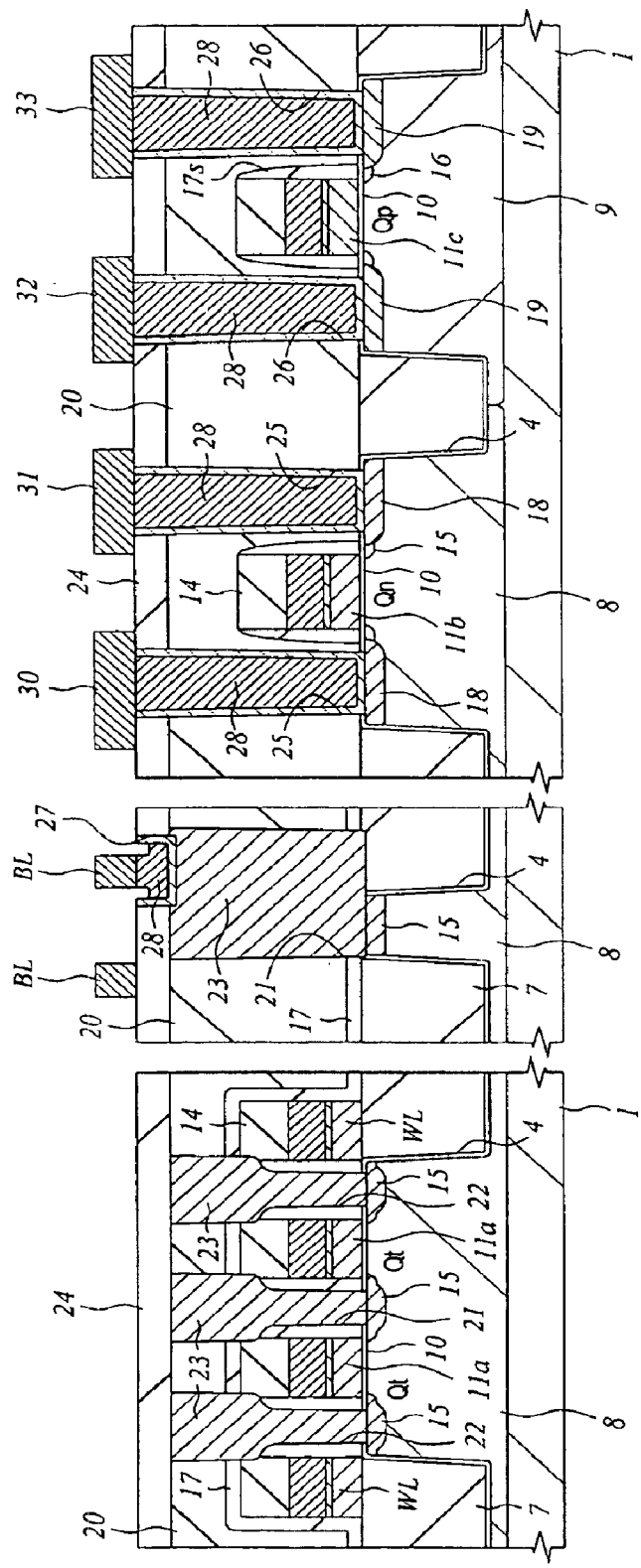
FIG. 24 is a section view of a principal part of a semiconductor substrate showing a manufacturing method for a DRAM-logic hybrid LSI according to one embodiment of the present invention.
Figure 25:
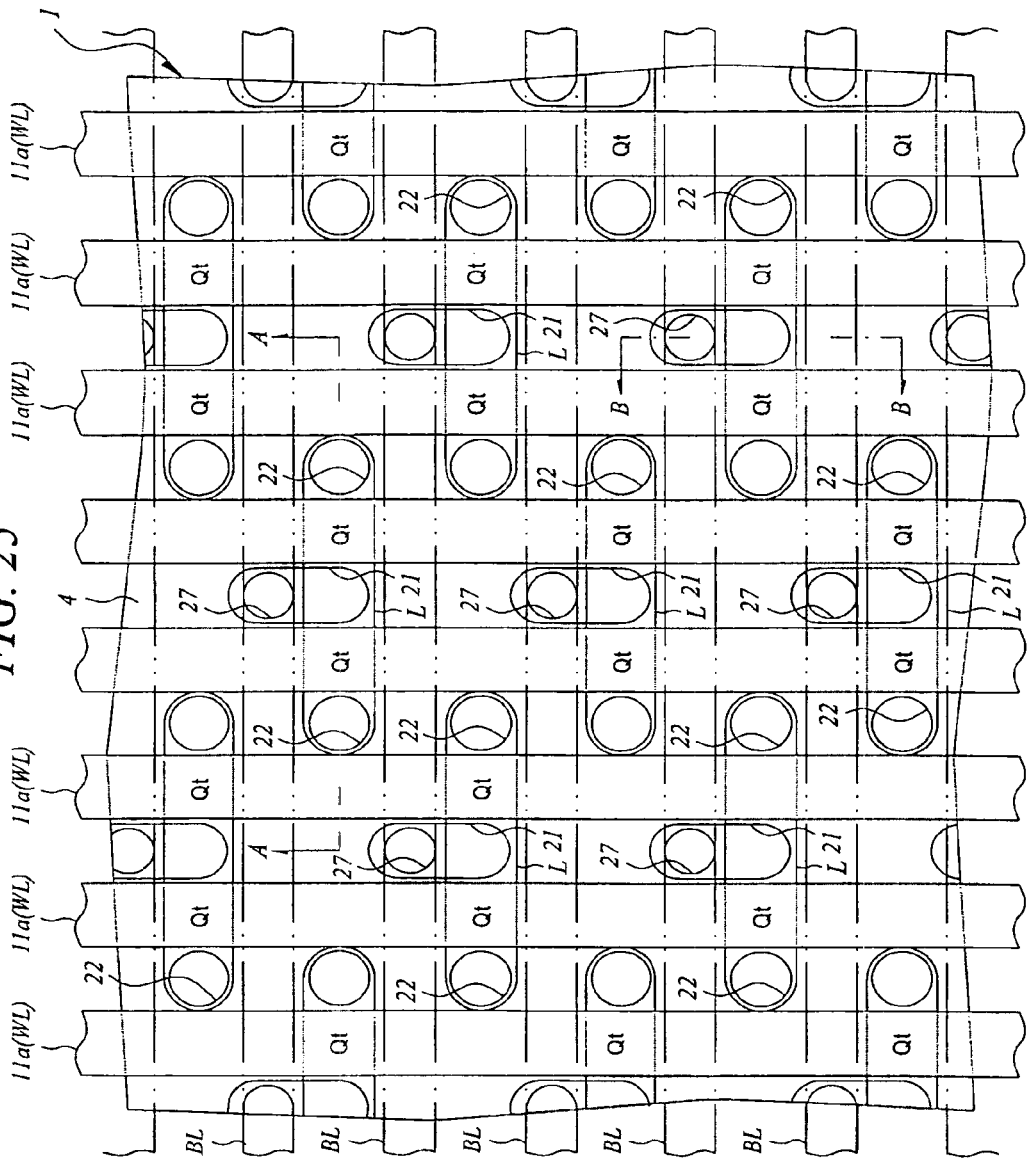
FIG. 25 is a plane view of a principal part of a semiconductor substrate showing a manufacturing method for a DRAM-logic hybrid LSI according to one embodiment of the present invention.

Next, as shown in FIGS. 24 and. 25, after plugs 28 are formed inside the above contact holes 25, 26, and 27, bit lines BL are formed on the silicon oxide 24 in the DRAM forming area and wirings 30 to 33 are formed on the silicon oxide 24 in the logic circuit forming area.

In order to form the plugs 28, for example, a TiN film and a W film are deposited, on the silicon oxide film including the respective insides of the contact holes 25 and 26 and the through hole 27, by the sputtering method and the CVD method. Thereafter, unnecessary W film and TiN film on the silicon oxide 24 are removed by the chemical mechanical polishing method. Further, to form the bit lines BL and the wirings 30 to 33, after a W film is deposited on the silicon oxide 24 by the sputtering method, the W film is patterned by dry-etching using a photoresist film as a mask. The bit line BL is electrically connected to one ($n^-$-type semiconductor region 15) of the source and drain of the memory cell selection MISFET Qt through the through hole 27 and the contact hole 21. Further, the wirings 30 and 31 are electrically connected to the source and drain ($n^+$-type semiconductor regions 18) of the n-channel MISFET Qn through the contact holes 25 and 25, and the wirings 32 and 33 are electrically connected to the source and drain ($p^+$-type semiconductor regions 19) of the p-channel MISFET Qp through the contact holes 26 and 26.

Figure 26:
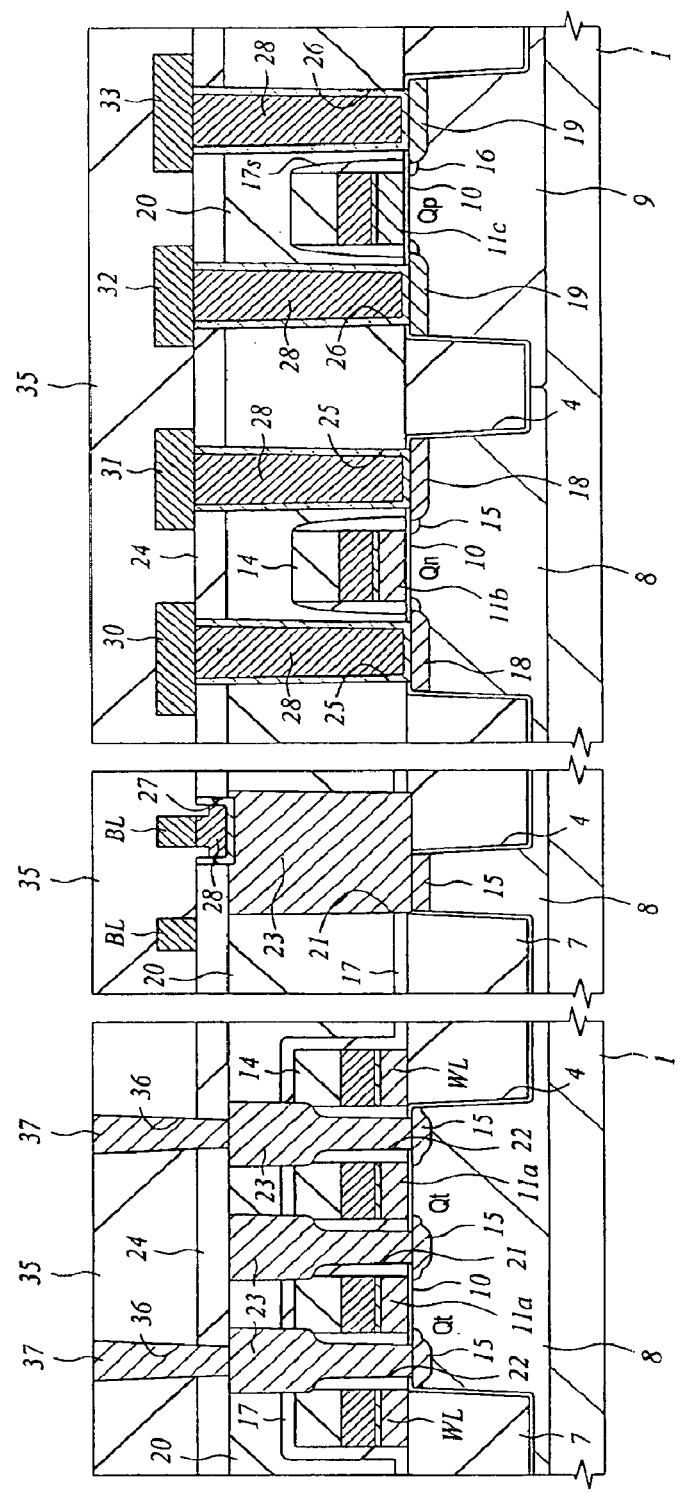
FIG. 26 is a section view of a principal part of a semiconductor substrate showing a manufacturing method for a DRAM-logic hybrid LSI according to one embodiment of the present invention.
Figure 27:
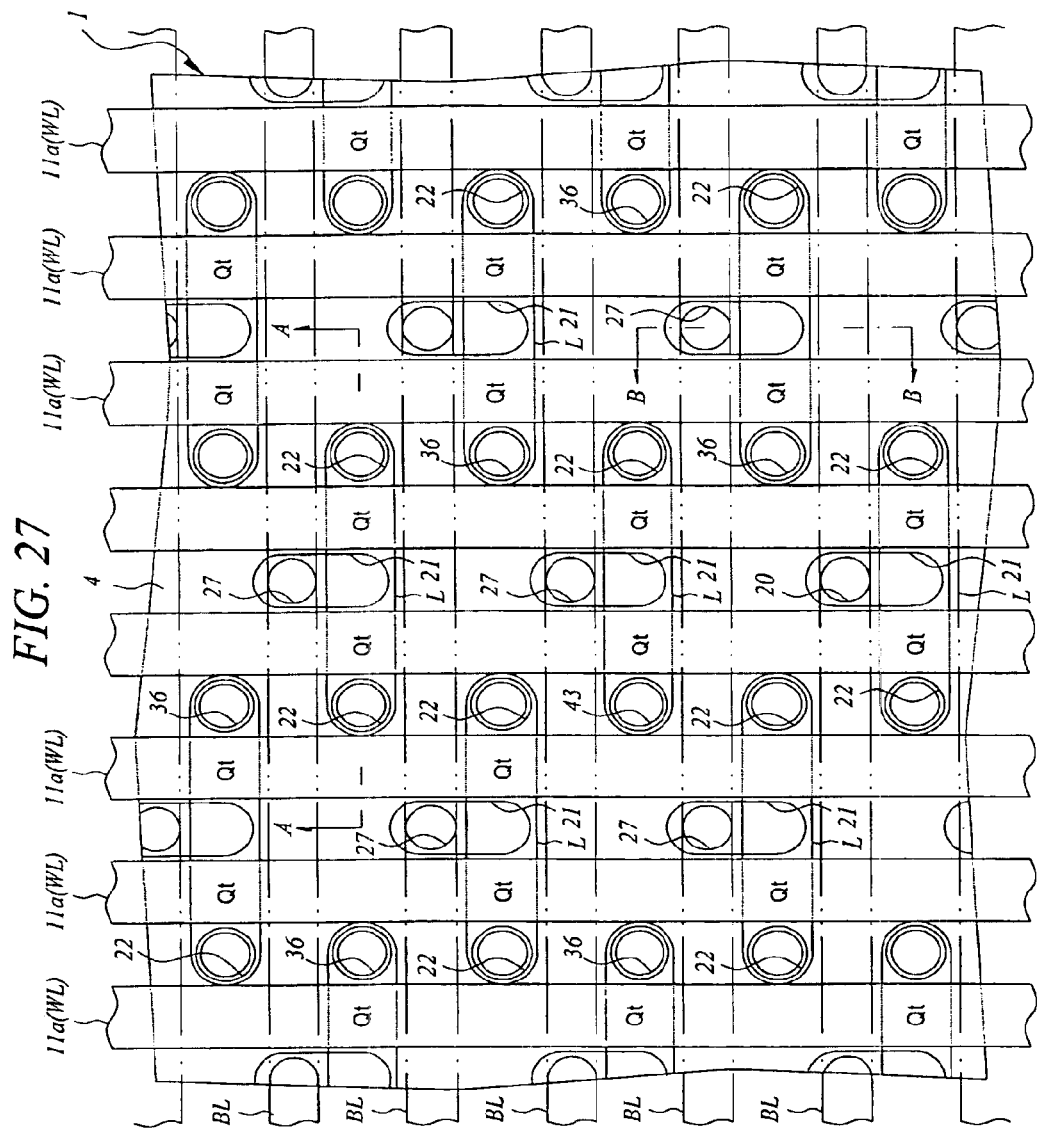
FIG. 27 is a plane view of a principal part of a semiconductor substrate showing a manufacturing method for a DRAM-logic hybrid LSI according to one embodiment of the present invention.

Next, as shown in FIGS. 26 and 27, a silicon oxide 35 is deposited on the bit lines BL and the wirings 30 to 33 by the CVD method, and subsequently the silicon oxides 35 and 24 on the contact holes 22 are dry-etched to form through holes 36, and then plugs 37 made of a polycrystal silicon are formed inside the through holes 36. In order to form the plugs 37, after a polycrystal silicon, in which P (phosphorus) is doped, is deposited inside the through holes 36 and on the silicon oxide 35 by the CVD method, an unnecessary polycrystal silicon on the silicon oxide 35 is removed by dry-etching (or chemical mechanical polishing method).

Figure 28:
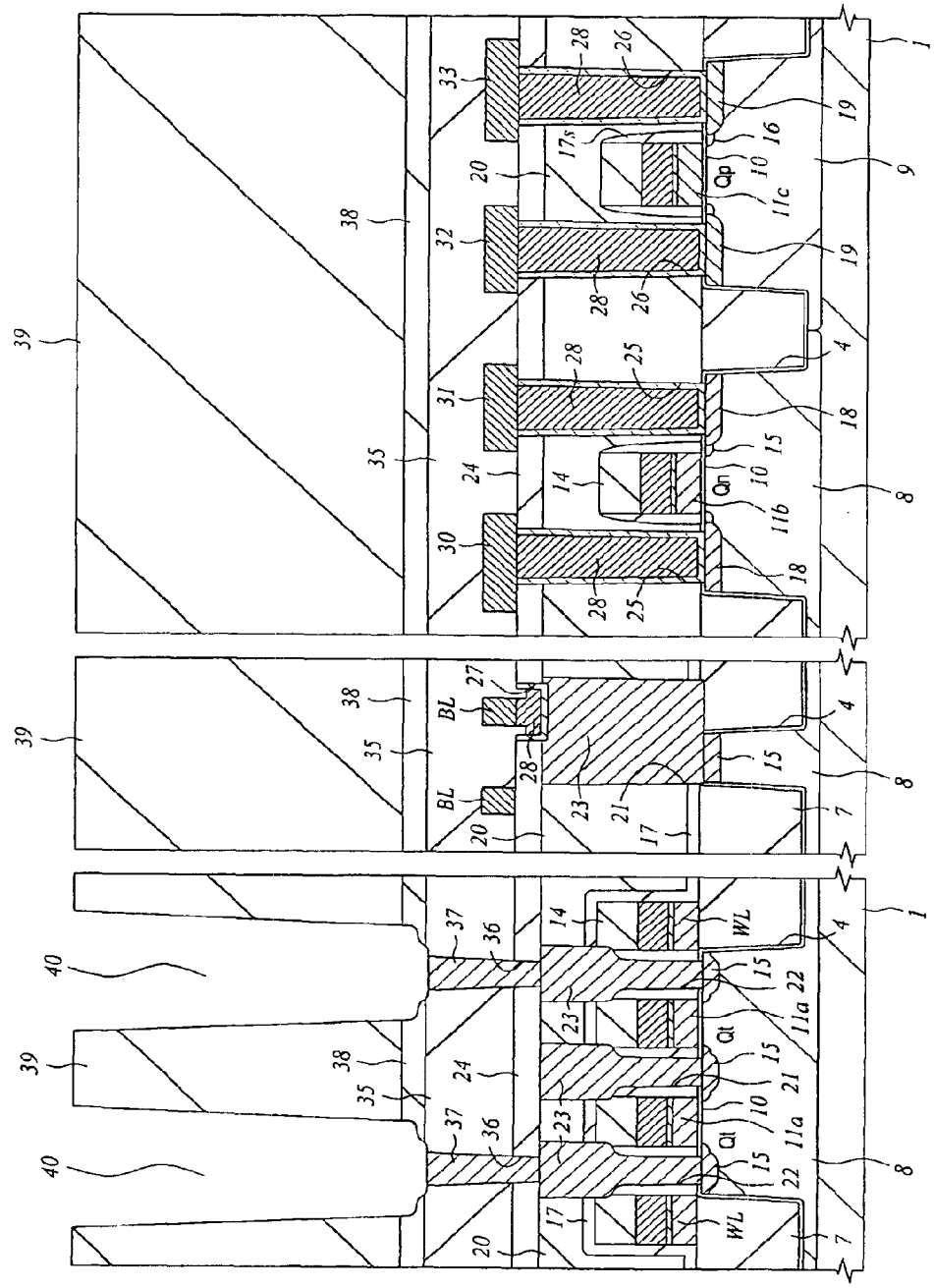
FIG. 28 is a section view of a principal part of a semiconductor substrate showing a manufacturing method for a DRAM-logic hybrid LSI according to one embodiment of the present invention.

Next, as shown in FIG. 28, after a silicon nitride 38 is deposited at an upper portion of the silicon oxide 35 by the CVD method and subsequently a silicon oxide 39 is deposited at an upper portion of the silicon nitride 38 by the CVD method, the silicon oxide 39 and the silicon nitride 38 on the through holes 36 are dry-etched to form grooves 40.

Figure 29:
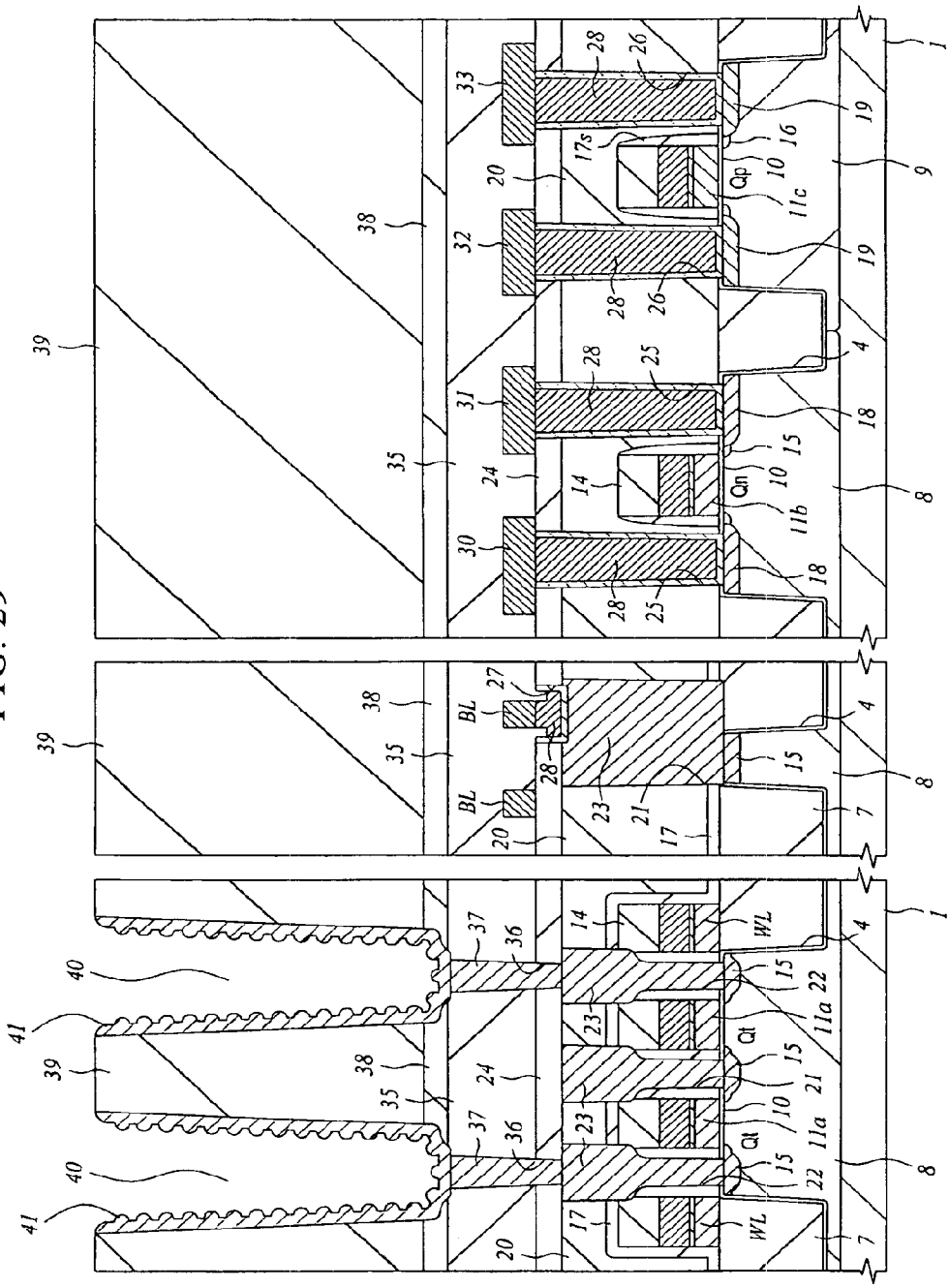
FIG. 29 is a section view of a principal part of a semiconductor substrate showing a manufacturing method for a DRAM-logic hybrid LSI according to one embodiment of the present invention.

Next, as shown in FIG. 29, lower electrodes 41 made of a polycrystal silicon are formed on inner walls of the grooves 40. In order to form the lower electrode 41, after an amorphous silicon film (not shown), in which P (phosphorus) is doped, is deposited inside the grooves 40 and on the silicon oxide 39 by the CVD method, an unnecessary amorphous silicon film on the silicon oxide 39 is removed by dry-etching. Next, after a surface of the amorphous silicon remaining inside the grooves 40 is wet-cleaned by a hydrofluoric acid based cleaning liquid, monosilane ($SiH_4$) is supplied on the surface of the amorphous silicon in a reduced pressure atmosphere. Subsequently, the substrate 1 is thermally processed to polycrystalize the amorphous silicon film and to grow silicon particles on the surface thereof. Thus, the lower electrodes 41, each made of the polycrystal silicon whose the surface is made coarse, are formed. Since the polycrystal silicon, whose surface is made coarse, has a large surface area, the amount of charges stored in a fine information storage capacitive element can be increased.

Figure 30:
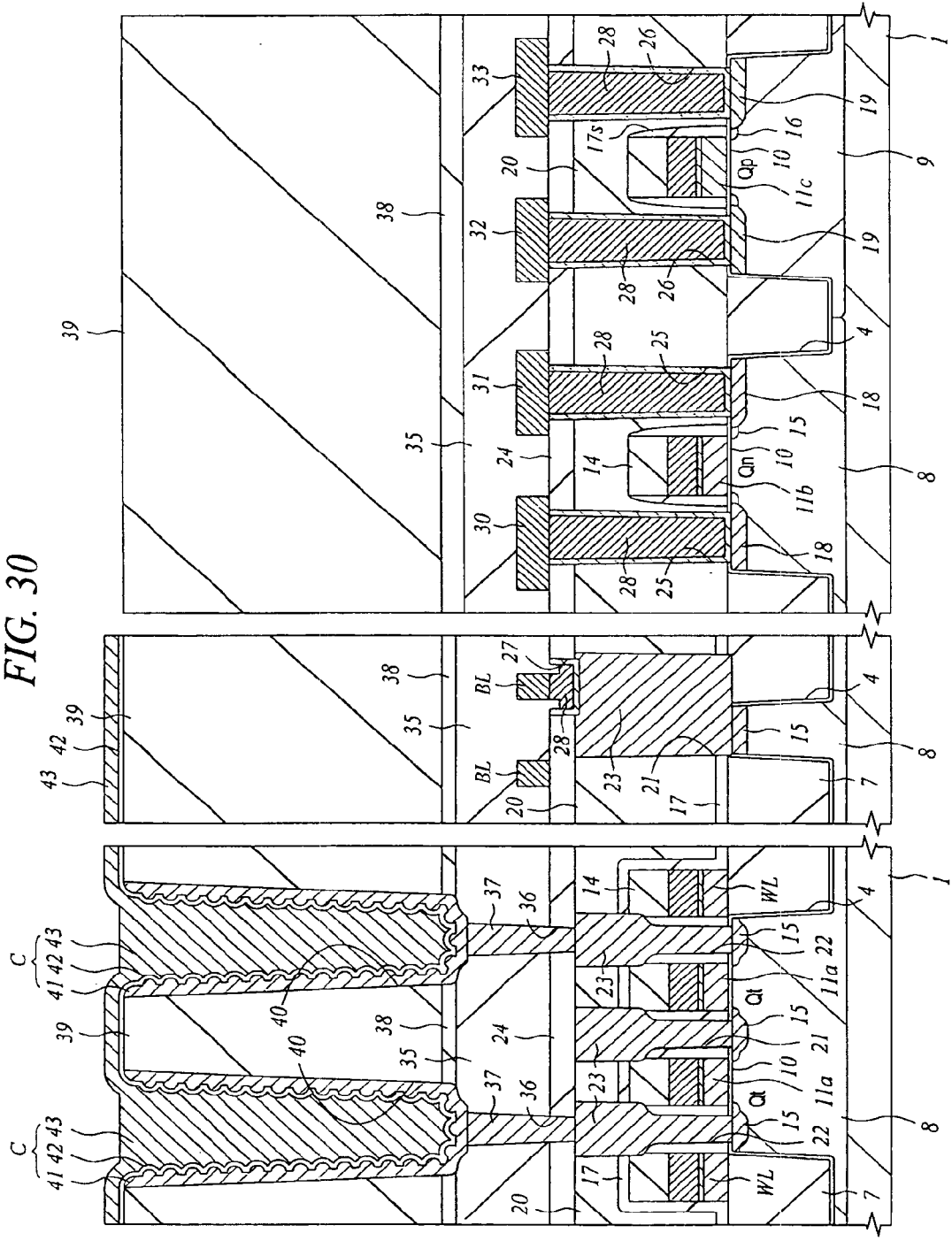
FIG. 30 is a section view of a principal part of a semiconductor substrate showing a manufacturing method for a DRAM-logic hybrid LSI according to one embodiment of the present invention.

Next, as shown in FIG. 30, a capacity insulator 42 made of a $Ta_2O_5$ (tantalum oxide) film is formed, on the lower electrodes 41 formed inside the grooves 40, and upper electrodes 43 each made of a TiN film are formed on the capacity insulator 42, whereby information storage capacitive elements C, each comprising the lower electrode 41, the capacity insulator 42, and the upper electrode 43, are formed. The capacity insulator 42 of the information storage capacitive element C may be made of a film whose the main component is high dielectrics or ferroelectrics having a perovskite structure or a complex perovskite crystal structure, such as PZT, PLT, PLZT, $PbTiO_3$, $SrTiO_3$, $BaTiO_3$, BST, SBT or $Ta_2O_5$ in addition to a $Ta_2O_5$ film. Through the steps so far, a DRAM memory cell, comprising the memory cell selection MISFET Qt and the information storage capacitive element C connected in series thereto, is completed.

Although illustration is omitted, thereafter, about two layers of Al wirings are formed on the information storage capacitive elements C by sandwiching the interlayer insulator made of a silicon oxide. Further, a passivation film, comprising a laminated film of a silicon nitride and a silicon oxide, is formed on the Al wirings, whereby the DRAM according to the present embodiment is completed. Since the silicon nitride constructing a part of the passivation film is deposited at a thickness of 1 $\mu$m or more, the film forming with high throughput is required. Further, in a step after the memory cell selection MISFET Qt or the information storage capacitive element C are formed, it is required that the film forming is performed at the low temperature. Therefore, the silicon nitride, constructing the part of the passivation film, is formed at a low temperature of approximately 400° C. by using not the CVD device shown in FIG. 10 but the well-known butch-type plasma CVD device.

(Second Embodiment)

A semiconductor integrated circuit device according to the present embodiment is a CMOS-logic LSI. A manufacturing method for this LSI will be described in order of step using FIGS. 31 to 39.

Figure 31:
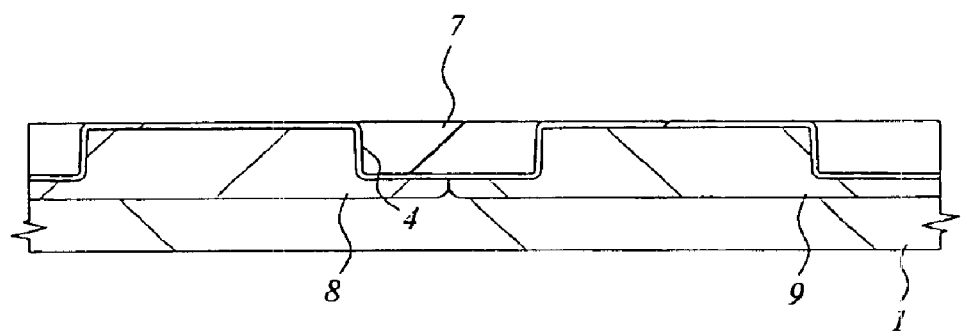
FIG. 31 is a section view of a principal part of a semiconductor substrate showing a manufacturing method for a DRAM-logic hybrid LSI according to another embodiment of the present invention.
Figure 32:
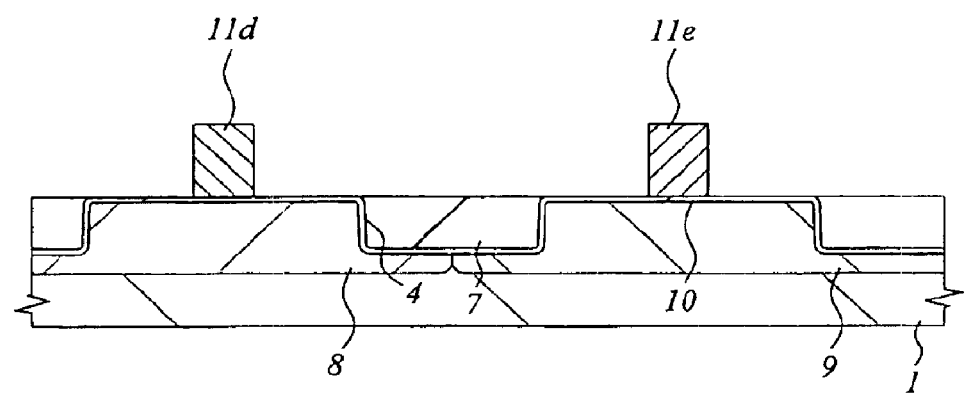
FIG. 32 is a section view of a principal part of a semiconductor substrate showing a manufacturing method for a DRAM-logic hybrid LSI according to another embodiment of the present invention.

As shown in FIG. 31, at first the shallow groove isolation 4, the p-type well 8, and the n-type well 9 are formed on the substrate 1 by the similar method to the first embodiment. Next, after the surface of the substrate 1 is cleansed by wet-etching using hydrofluoric acid, as shown in FIG. 32, the substrate 1 is thermally oxidized at approximately 800° C. to 850° C. to form the clean gate insulator 10 over the respective surfaces of the p-type well 8 and the n-type well 9 and sequentially to form electrodes 11d and 11e on the gate insulator 10. The gate electrodes 11d and 11e are formed by: depositing a polycrystal silicon having a thickness of approximately 200 nm to 250 nm, on the gate insulator 10 by the CVD method; subsequently ion-implanting n-type impurities (phosphorus) into a part of the polycrystal silicon; ion-implanting p-type impurities (boron) into other part thereof; and thereafter using a photoresist film as a mask to dry-etch the polycrystal silicon. The gate electrode 11d is made of an n-type polycrystal silicon, in which phosphorus is doped, and is used as a gate electrode of the n-channel MISFET (Qn) constructing a part of the logic circuit. The gate electrode 11e is made of a p-type polycrystal silicon, in which boron is doped, and is used as a gate electrode of the p-channel MISFET (Qp) constructing a part of the logic circuit.

Figure 33:
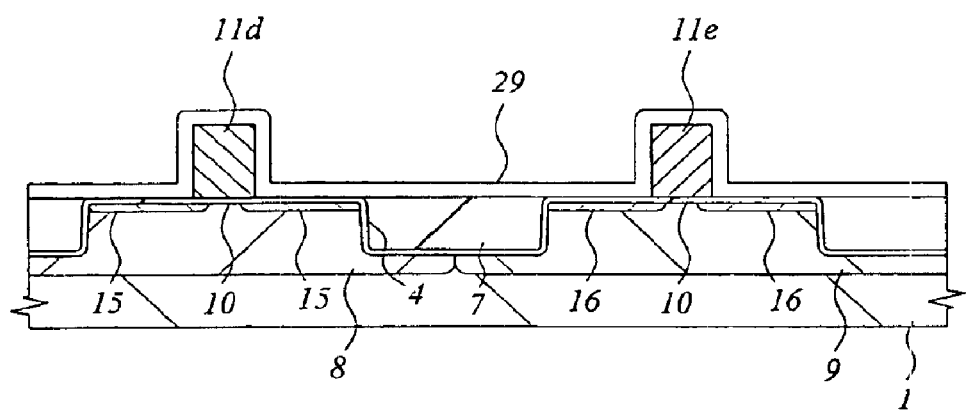
FIG. 33 is a section view of a principal part of a semiconductor substrate showing a manufacturing method for a DRAM-logic hybrid LSI according to another embodiment of the present invention.

Next, as shown in FIG. 33, phosphorus or arsenic (As) is ion-implanted into the p-type well 8 to form the n$^-$-type semiconductor regions 15 having a low impurity concentration, and boron is ion-implanted into the n-type well 9 to form the p$^-$-type semiconductor regions 16 having a low impurity concentration. Thereafter, a silicon nitride 29 having a thickness of approximately 50 nm is deposited over the main surface of the substrate 1 by the CVD method. In the present embodiment, this silicon nitride 29 is deposited by using the following device.

Figure 34:
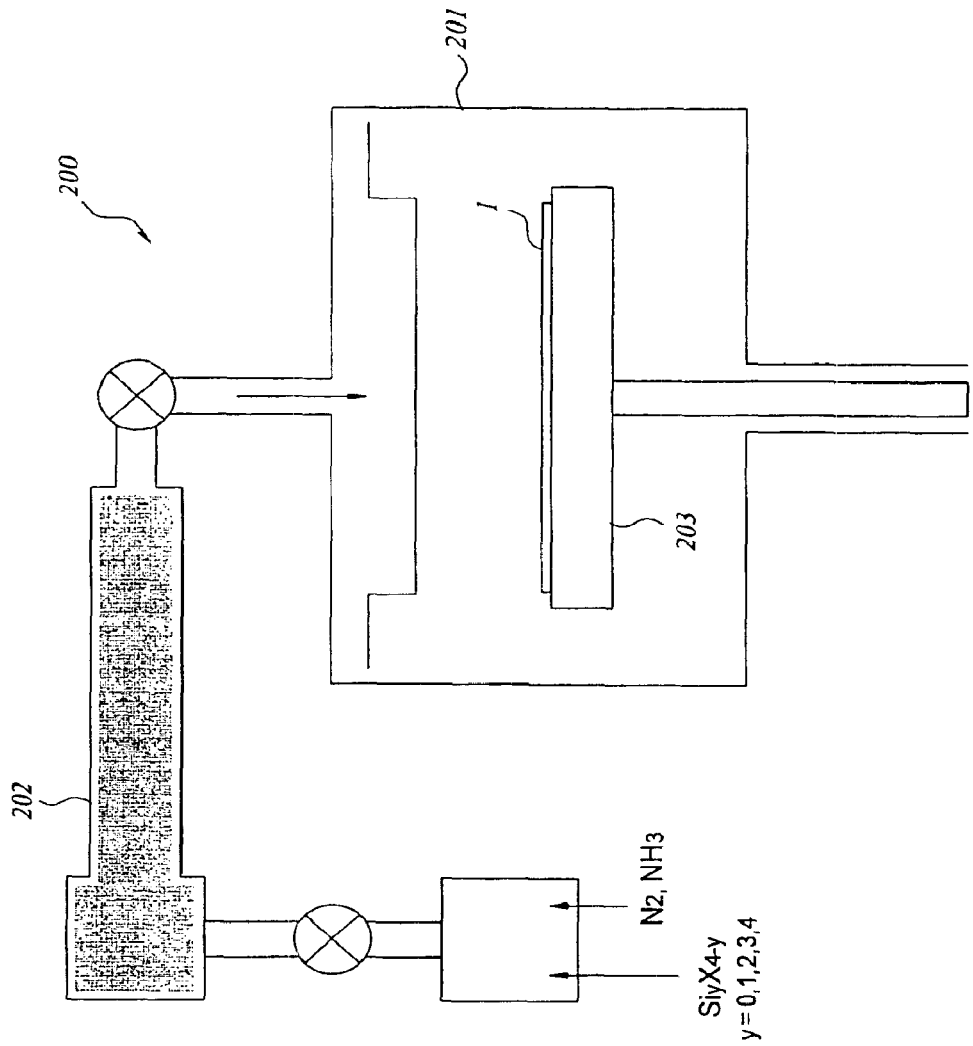
FIG. 34 is a schematic diagram showing a principal part of a CVD device used in another embodiment of the present invention.

FIG. 34 is a schematic diagram showing a principal part of a CVD device 200 used for depositing the silicon nitride 29. The CVD device 200 is provided with a remote plasma unit (plasma processing unit) 202 for generating plasma by utilizing microwaves, outside the chamber 201 serving as the film-forming processing unit. A source gas is radically degraded in this remote plasma unit 202, and then is introduced into the chamber 201. The chamber 201 has the cold wall structure where only the wafer 1 on the stage 203 is heated similarly to the CVD device 100 of the first embodiment.

In this manner, since the above CVD device 200 has the structure where the remote plasma unit 202 for plasma-degrading the source gas and the chamber 201 are separated from each other, the wafer 1 on the stage 203 is hardly influenced by plasma. That is, since it is possible to set RF power to be high (for example, a frequency of 400 kHz, an output of 5 kW or more) and to promote degradation of the source gas without considering damage on the wafer 1, the Si—H bond and the N—H bond in the source gas can be substantially completely degraded. Therefore, it is not required that the temperature of the wafer 1 is set to be high, thereby allowing heat load of the device to be reduced. Further, since bias is not applied on the wafer 1 unlike the existing plasma CVD device, the film forming with high step coverage can be achieved.

A practical lower limit temperature of the stage 203 during the film forming is in the vicinity of 0° C. However, there is the danger that the throughput in the film forming is reduced when the temperature of the stage 203 is too low, or that intermediate products of the source gas, generated in the remote plasma unit 202, are cooled in the mid-course of reaching the surface of the wafer 1 to generate impurities. Therefore, the lower limit temperature should be preferably set at 400° C. or more. An upper limit temperature of the stage 203 is an upper limit temperature, which is allowed from the viewpoint of the characteristics of the device formed over the main surface of the wafer 1, and is set at, for example, 700° C. to 750° C. in the case of the CMOS logic LSI according to the present embodiment.

The inner wall of the chamber 201 is maintained, for example, at 100° C. or less. Since the temperature of the inner wall is made lower so that radicals introduced into the chamber 201 are difficult to attach on the inner wall, the film-forming rate is increased. Thus, even if the temperature of the stage 203 is lowered, the film forming can be performed in a short time, whereby the heat load of the device can be further reduced.

A pressure of the source gas is in a range of 0.013 kPa (0.1 Torr) or more to 1.3 kPa (10 Torr) or less, and is preferably in the vicinity of 0.2 kPa (0.5 Torr) generally.

The source gas used for forming the silicon nitride 14 may be a well-known source gas used for forming a silicon nitride by using the reduced pressure CVD (LP-CVD) device, for example, a combination of a silicon compound generally indicated by $SiH_yX_{(4-y)}$ (X is halogen such as F, Cl, Br, and I, and y is 0, 1, 2, 3, or 4) such as $SiH_4$ or $Si_2H_6$, and of $NH_3$, $N_2H_4$ or $N_2$, or the like. When the source gas containing no hydrogen in a molecular among the above silicon compounds, for example, a combination of a silicon compound such as $SiF_4$, $SiCl_4$, $Si_2Cl_6$, $SiBr_4$, and $SiI_4$, and of $N_2$ is used, a concentration of hydrogen in the silicon nitride can be further reduced.

Since the above CVD device 200 is used to deposit the silicon nitride 12, the concentration of hydrogen in contained the film immediately after the film forming can be set at $2\times10^{21}$ atoms/cm$^3$ or less, preferably at $1\times10^{21}$ atoms/cm$^3$ or less, and more preferably at $0.5\times10^{21}$ atoms/cm$^3$, thereby allowing the NBTI lifetime of the device to be securely improved.

Figure 35:
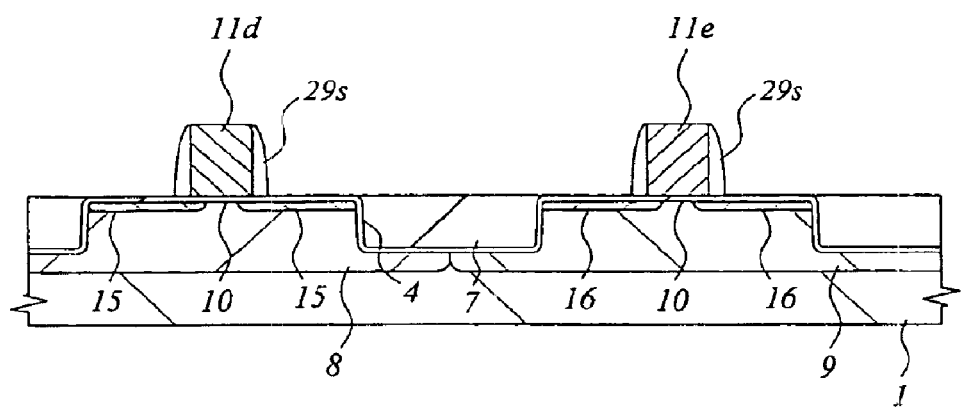
FIG. 35 is a section view of a principal part of a semiconductor substrate showing a manufacturing method for a DRAM-logic hybrid LSI according to another embodiment of the present invention.
Figure 36:
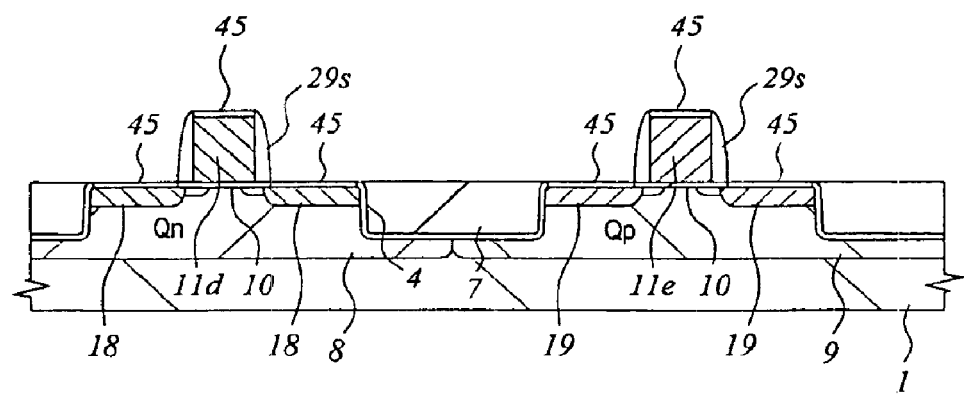
FIG. 36 is a section view of a principal part of a semiconductor substrate showing a manufacturing method for a DRAM-logic hybrid LSI according to another embodiment of the present invention.

Next, as shown in FIG. 35, the above silicon nitride 29 is anisotropically dry-etched to form sidewall spacers 29s are formed on the respective sidewalls of the gate electrodes 11d and 11e. Next, as shown in FIG. 36, phosphorous or arsenic (As) is ion-implanted into the p-type well 8 to form the n$^+$-type semiconductor regions (source and drain) 18 having high impurity concentration, and boron is ion-implanted into the n-type well 9 to form the p$^+$-type semiconductor regions (source and drain) 19 having high impurity concentration. Subsequently, the gate insulators 10 on the respective surfaces of the n$^+$-type semiconductor regions (source and drain) 18 and the p$^+$-type semiconductor regions (source and drain) 19 are removed by wet-etching using hydrofluoric acid. Thereafter, a Co film is deposited over the substrate 1 by the sputtering method, and a Co silicide layer 45 is formed, on the respective surfaces of the gate electrodes 11d, 11e, the n$^+$-type semiconductor regions (source and drain) 18, and the p$^+$-type semiconductor regions (source and drain) 19, through a silicide reaction by the thermal processing. Then, the unreacted Co film is removed by the wet-etching. Through the steps so far, the n-channel MISFET Qn and the p-channel MISFET Qp constructing the logic LSI are formed.

Figure 37:
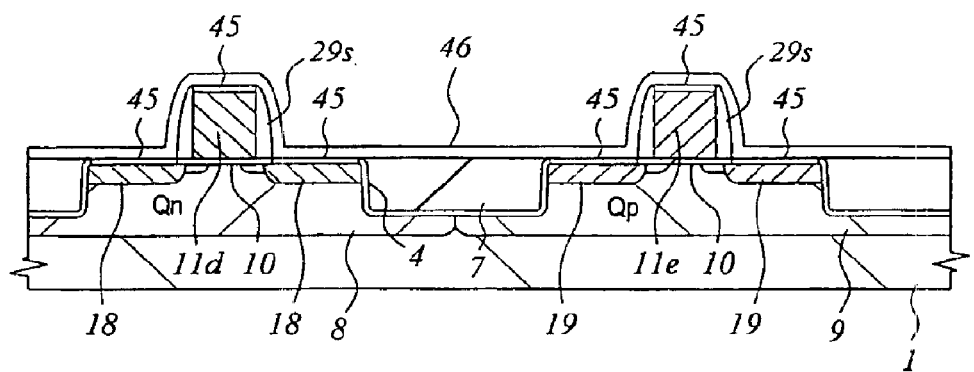
FIG. 37 is a section view of a principal part of a semiconductor substrate showing a manufacturing method for a DRAM-logic hybrid LSI according to another embodiment of the present invention.

Next, as shown in FIG. 37, a silicon nitride 46 having a thickness of approximately 50 nm is deposited over the main surface of the substrate 1 by the CVD method. This silicon nitride 46 is deposited by using the above CVD device 200 used for depositing the silicon nitride 29. The film-forming conditions may be identical to the film-forming conditions of the silicon nitride 46 described above. Further, the silicon nitride 29 or the silicon nitride 46 may be deposited by using the CVD device 100 according to the first embodiment.

Figure 38:
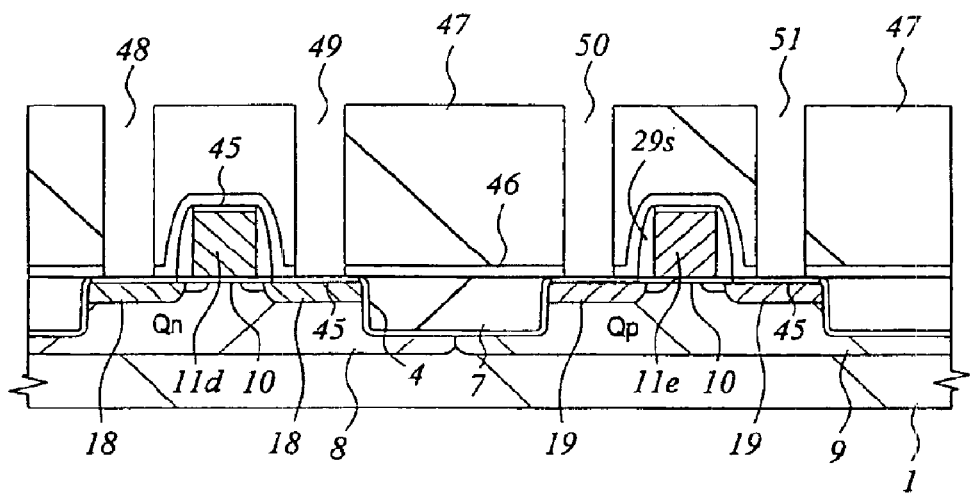
FIG. 38 is a section view of a principal part of a semiconductor substrate showing a manufacturing method for a DRAM-logic hybrid LSI according to another embodiment of the present invention.

Next, as shown in FIG. 38, after a silicon oxide 47 is deposited on the silicon nitride 46 by the plasma CVD method using, for example, oxygen and tetraethoxysilane as a source gas, the silicon oxide 47 and the silicon nitride 46 are sequentially dry-etched by using a photoresist film (not shown) as a mask to form contact holes 48 to 51 on the n+-type semiconductor regions (source and drain) 18 and the p+-type semiconductor regions (source and drain) 19.

The dry-etching of the above silicon oxide 47 is performed, by using the silicon nitride 46 as a stopper, under the condition that the etching rate of the silicon oxide 47 is larger than that of the silicon nitride 46. Further, the etching of the silicon nitride 46 is performed under the condition that the etching rate thereof is larger than that of the silicon oxide 7 embedded in the shallow groove isolation 4.

Figure 39:
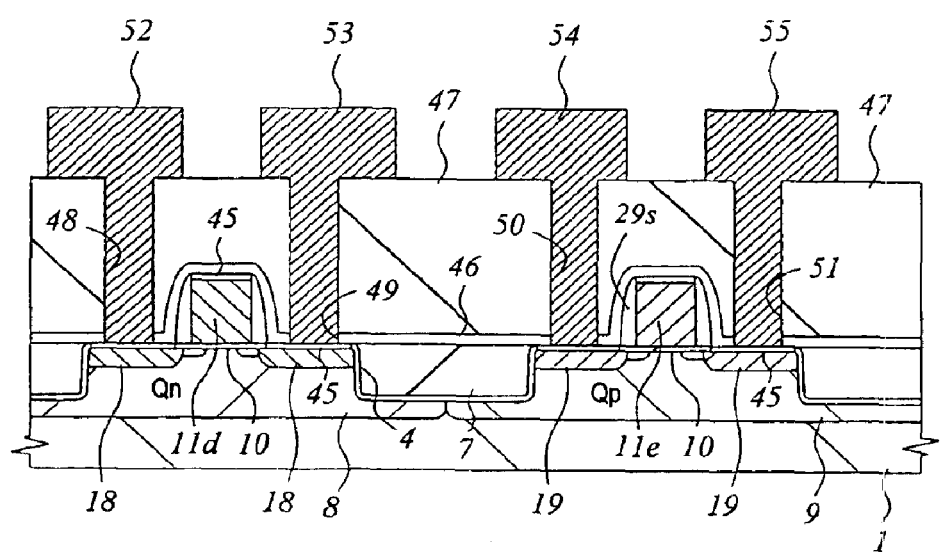
FIG. 39 is a section view of a principal part of a semiconductor substrate showing a manufacturing method for a DRAM-logic hybrid LSI according to another embodiment of the present invention.

Next, as shown in FIG. 39, a metal film, deposited on the silicon oxide 47, is patterned to form a first layer of wirings 52 to 55.

(Third Embodiment)

A semiconductor integrated circuit device according to the present embodiment is a flash memory. Hereinafter, one example of a manufacturing method for this flash memory will be described in order of step by using FIGS. 40 to 52.

Figure 40:
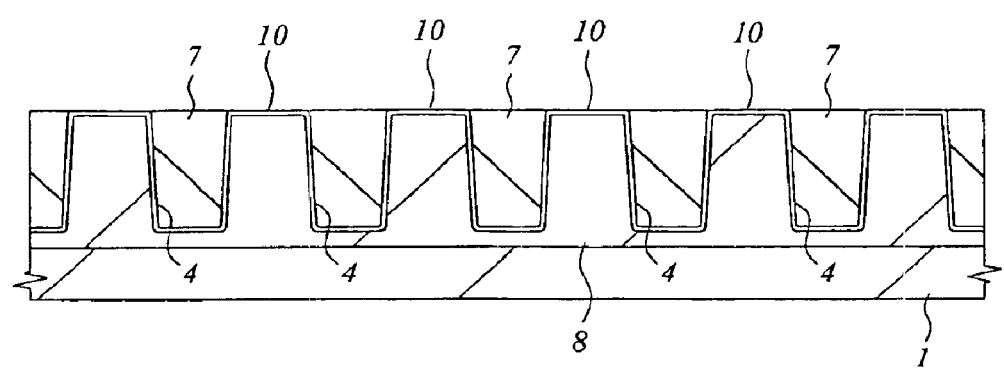
FIG. 40 is a section view of principal part of a semiconductor substrate showing a manufacturing method for a flash memory according to another embodiment of the present invention.
Figure 41:
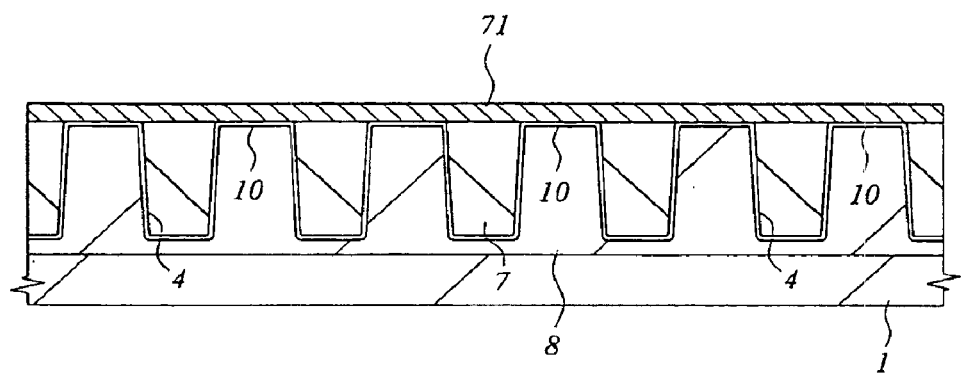
FIG. 41 is a section view of principal part of a semiconductor substrate showing a manufacturing method for a flash memory according to another embodiment of the present invention.
Figure 42:
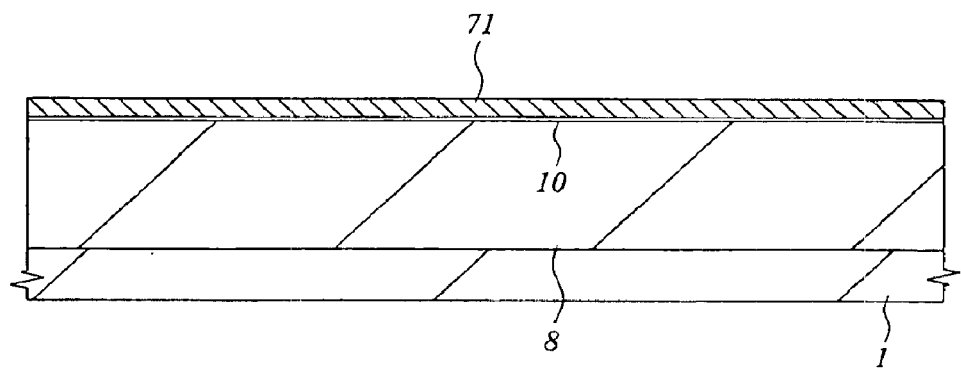
FIG. 42 is a section view of principal part of a semiconductor substrate showing a manufacturing method for a flash memory according to another embodiment of the present invention.

As shown in FIG. 40, at first, after the shallow groove isolation 4, the p-type well 8, and the gate insulator 10 are formed over the main surface of the substrate 1 by the similar method to the first embodiment, as shown in FIGS. 41 and 42, a polycrystal silicon 71 having a thickness of approximately 70 nm to 100 nm is deposited over the substrate 1 by the CVD method. Into the polycrystal silicon 71, n-type impurities, for example, phosphorous (P) is doped during the depositing step thereof. Alternatively, n-type impurities may be doped by an ion-implanting method after a non-doped polycrystal silicon is deposited. The polycrystal silicon 71 is used as a floating gate electrode of the MISFET constructing the memory cell.

Figure 43:
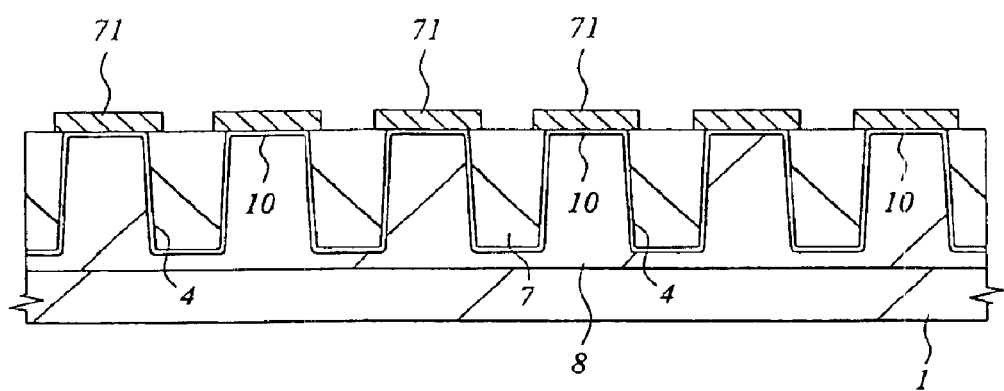
FIG. 43 is a section view of principal part of a semiconductor substrate showing a manufacturing method for a flash memory according to another embodiment of the present invention.
Figure 44:
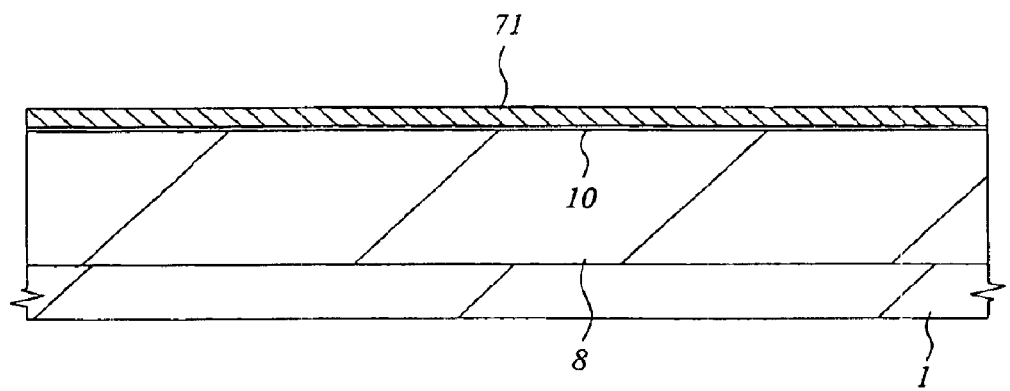
FIG. 44 is a section view of principal part of a semiconductor substrate showing a manufacturing method for a flash memory according to another embodiment of the present invention.

Next, as shown in FIGS. 43 and 44, the polycrystal silicon 71 is dry-etched by using a photoresist film (not shown) as a mask to form, on the active regions, the polycrystal silicon 71, which has an elongated strip-like plane pattern extending along its extending direction.

Figure 45:
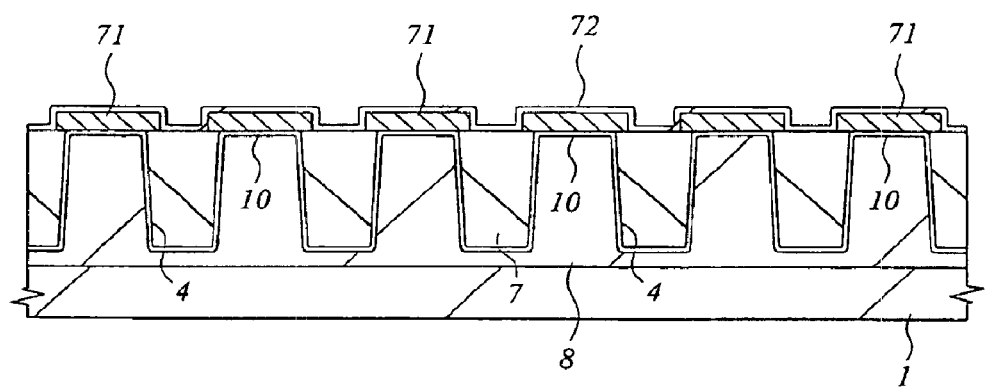
FIG. 45 is a section view of principal part of a semiconductor substrate showing a manufacturing method for a flash memory according to another embodiment of the present invention.
Figure 46:
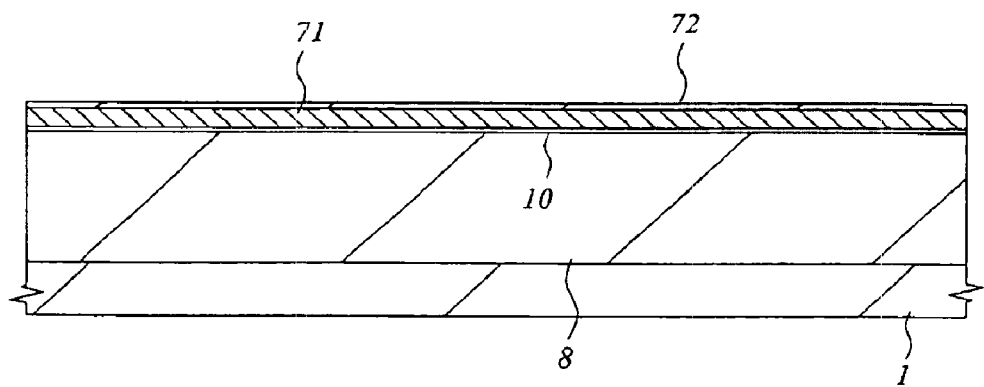
FIG. 46 is a section view of principal part of a semiconductor substrate showing a manufacturing method for a flash memory according to another embodiment of the present invention.

Next, as shown in FIGS. 45 and 46, an ONO film 72, comprising a silicon oxide, a silicon nitride, and a silicon oxide, is formed over the substrate 1 over which the polycrystal silicon 71 is formed. The ONO film 72 is used as a second gate insulator of the MISFET constructing the memory cell, and is formed by, for example, sequentially depositing a 5 nm thick silicon oxide, a 7 nm thick silicon nitride, and a 4 nm thick silicon oxide over the substrate 1 by the CVD method.

Figure 47:
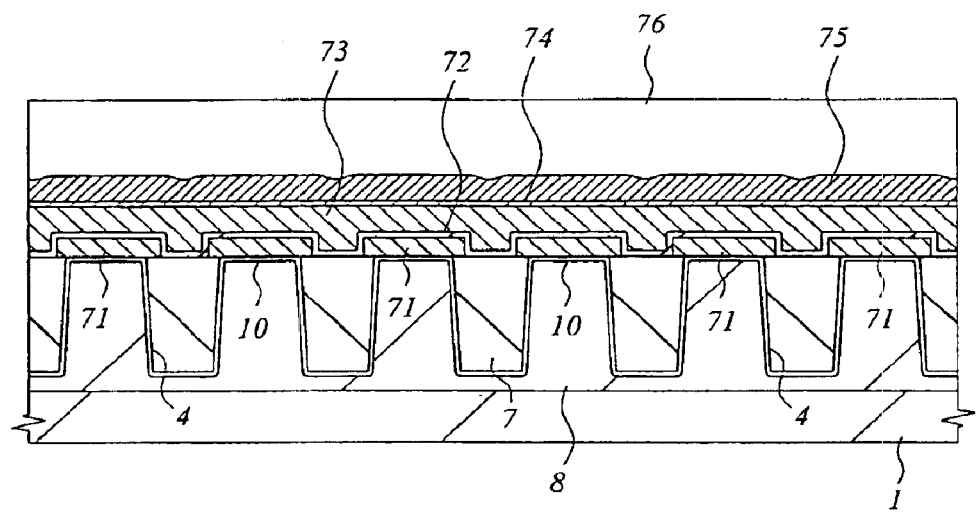
FIG. 47 is a section view of principal part of a semiconductor substrate showing a manufacturing method for a flash memory according to another embodiment of the present invention.
Figure 48:
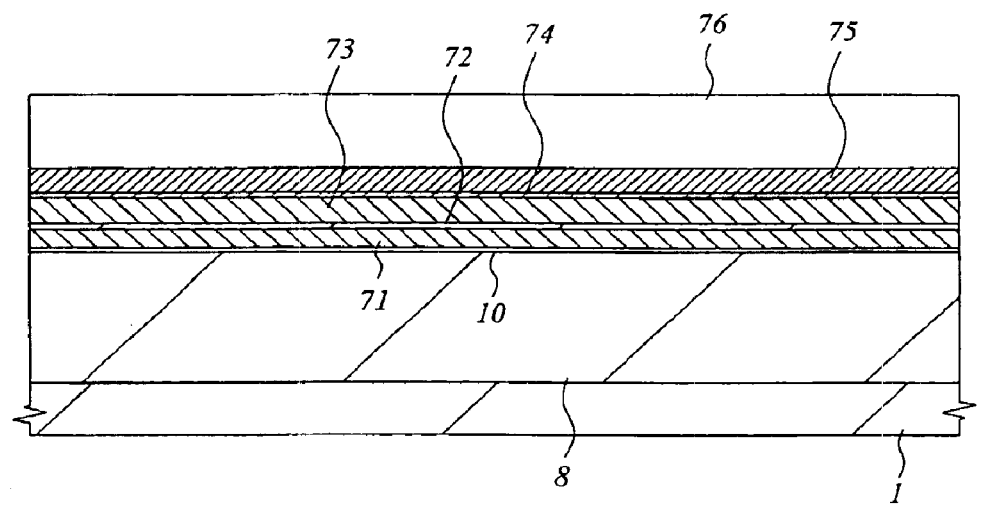
FIG. 48 is a section view of principal part of a semiconductor substrate showing a manufacturing method for a flash memory according to another embodiment of the present invention.

Next, as shown in FIGS. 47 and 48, an n-type polycrystal silicon 73 in which P (phosphorous) is doped, a $WN_x$ film 74, a W film 75, and a silicon nitride 76 are sequentially deposited on the ONO film 67. The polycrystal silicon 73, the $WN_x$ film 74, and the W film 75 are used as control gate electrodes (word lines WL) of the MISFET constructing the memory cell. Further, the silicon nitride 76 is used as an insulator for protecting the upper portions of the control gate electrodes. The polycrystal silicon 73 may be made of a silicon film containing approximately 50% of Ge (germanium) at maximum.

The silicon nitride 76 is deposited by using the CVD device 100 in the first embodiment or the CVD device 200 in the second embodiment. Thus, a concentration of hydrogen contained in the film immediately after the film forming can be set at $2\times10^{21}$ atoms/cm$^3$ or less, preferably $1\times10^{21}$ atoms/cm$^3$ or less, and more preferably $0.5\times10^{21}$ atoms/cm$^3$ or less.

Figure 49:
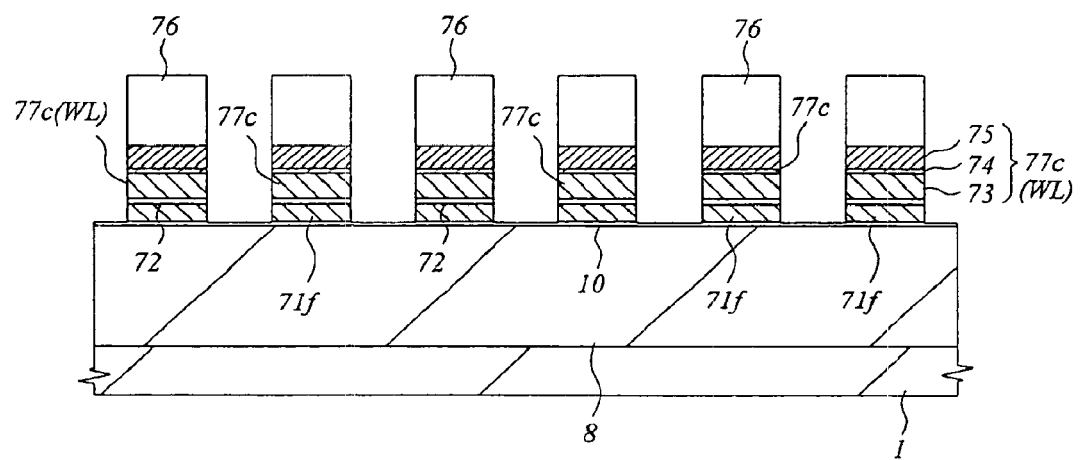
FIG. 49 is a section view of principal part of a semiconductor substrate showing a manufacturing method for a flash memory according to another embodiment of the present invention.

Next, as shown in FIG. 49, the silicon nitride 76, the W film 75, the $WN_x$ film 74, the polycrystal silicon 73, the ONO film 72, and the polycrystal silicon 71 are sequentially dry-etched by using a photoresist film (not shown) as a mask to form: floating gate electrodes 71f each comprising the polycrystal silicon 71; and control gate electrodes 77c (word lines WL) of a polymetal structure of comprising the W film 75, the $WN_x$ film 74, and the polycrystal silicon 73.

Figure 50:
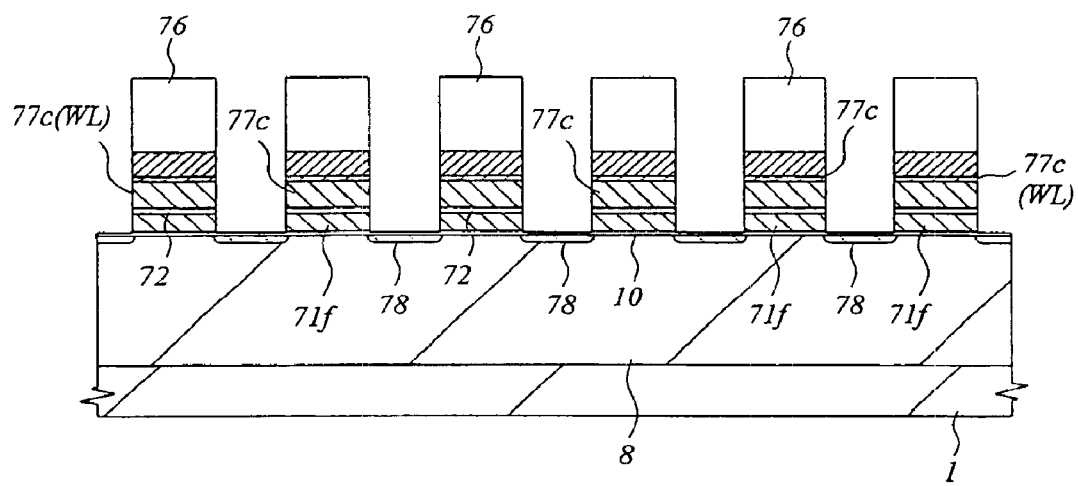
FIG. 50 is a section view of principal part of a semiconductor substrate showing a manufacturing method for a flash memory according to another embodiment of the present invention.

Next, as shown in FIG. 50, n-type semiconductor regions 70, constructing source and drain of the MISFET, are formed. The n-type semiconductor areas 70 are formed by: ion-implanting n-type impurities (for example, arsenic (As)) into the p-type well 3; thereafter thermally processing the substrate 1 at about 900° C.; and diffusing the above n-type impurities into the p-type well 3.

Figure 51:
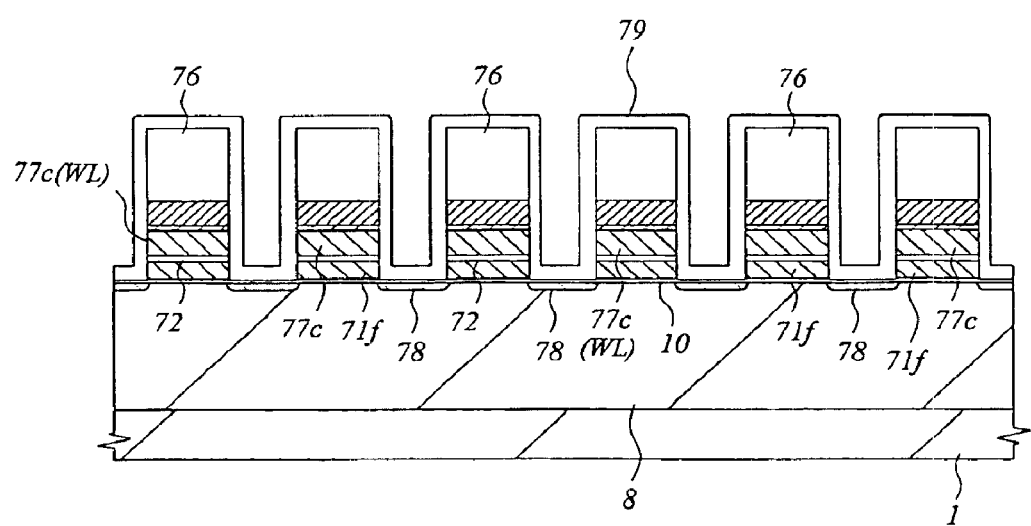
FIG. 51 is a section view of principal part of a semiconductor substrate showing a manufacturing method for a flash memory according to another embodiment of the present invention.

Next, after the surface of the substrate 1 is cleansed, as shown in FIG. 51, a silicon nitride 79 is deposited over the substrate 1. The silicon nitride 79 is deposited by using the CVD device 100 in the first embodiment or the CVD device 200 in the second embodiment. Thus, the concentration of hydrogen contained in the film immediately after the film forming is set at $2\times10^{21}$ atoms/cm$^3$ or less, preferably $1\times10^{21}$ atoms/cm$^3$ or less, and more preferably $0.5\times10^{21}$ atoms/cm$^3$ or less.

As described above, the invention made by the inventors has been concretely described based on the embodiments thereof. However, needless to say, the present invention is not limited to the above-mentioned embodiments and can be variously modified and altered without departing from the gist thereof.

Generally, a memory LSI such as a DRAM or a flash memory includes a memory mat and a peripheral circuit in one chip. In the memory mat, MISFETs constructing the memory cell are arranged in a high dense manner in order to realize a large storage capacity. However, in the peripheral circuit, the MISFETS are arranged in a non-dense manner as compared with the memory mat. Therefore, when gate electrodes of the MISFET are formed on the wafer, non-dense regions (peripheral circuit) and dense regions (memory mat) relative to the pattern densities of the gate electrodes occur in a plurality of chip regions partitioned on the wafer. As a result, the thickness of the silicon nitride covering the gate electrodes is different depending on the peripheral circuit and the memory mat.

In the case where the above problem (non-uniformity of the thickness) occurs, the silicon nitride is dry-etched to form the sidewall spacers on the sidewalls of the gate electrodes in the memory mat and on those of the gate electrodes in the peripheral circuit, or to form the contact holes for the gate electrodes and/or for the device isolation regions in a self-align manner. At this time, if a thick silicon nitride deposited in the peripheral circuit is completely etched, not only the thin silicon nitride deposited in the memory mat but also the surface of the base (the gate oxide film or the substrate) is grinded. Therefore, the characteristics of the MISFET, constructing the memory cell, are degraded.

The CVD device 100 in the first embodiment or the CVD device 200 in the second embodiment substantially completely degrades the source gas outside the chamber in advance, and then supplies the degraded gas to the surface of the wafer. Therefore, the uniformly thick silicon nitride can be formed without depending on the pattern densities of the gate electrodes even if there are the non-dense regions and the dense regions relative to the pattern densities of the gate electrodes.

INDUSTRIAL APPLICABILITY

The effects, obtained by the representative ones among the inventions disclosed in this application, will be briefly described as follows.

According to one embodiment of the present invention, a silicon nitride, containing a small amount of hydrogen, can be formed without giving heat load on the transistor, thereby allowing the NBTI lifetime of the device to be improved.

According to another embodiment of the present invention, a silicon nitride, containing a small amount of hydrogen, can be formed without giving plasma damage to the transistor, thereby allowing the NBTI lifetime of the device to be improved.

What is claimed is:

1. A method of manufacturing a semiconductor integrated circuit device, comprising the steps of:

(a) introducing, to a heat processing unit, a source gas containing a first gas having molecular silicon and a second gas having molecular nitrogen, and heat-processing said source gas at a temperature equal to or more than respective thermal degradation temperatures of said first and second gases; and (b) supplying, to a film-forming processing unit, a gas containing degradation products of said first and second gauss generated in said heat processing unit, and depositing a first insulator, whose a main component is a silicon nitride, over a main surface of a semiconductor wafer maintained at a temperature lower than the thermal degradation temperature of said source gas and having a first conductive film formed thereon to be a gate electrode, wherein said silicon nitride is a sidewall spacer covering an upper surface of said gate electrode, or an etching stopper film used in forming a contact hole relative to said gate electrode in a self-align manner, and said film-forming processing unit has a cold wall structure to heat said semiconductor wafer to a temperature higher than a temperature of an inner wall of said film-forming processing unit.

2. The method according to claim 1, wherein a concentration of hydrogen contained in said silicon nitride is $2\times10^{21}$ atoms/cm$^3$ or less.

3. The method according to claim 1, wherein a concentration of hydrogen contained in said silicon nitride is $1\times10^{21}$ atoms/cm$^3$ or less.

4. The method according to claim 1, wherein a concentration of hydrogen contained in said silicon nitride film is $0.5\times10^{21}$ atoms/cm$^3$ or less.

5. The method according to claim 1, wherein said first gas contains monosilane (SiH$_4$) or dichiorosilane (SiH$_2$Cl$_2$) and said second gas contains amnonia (NH$_3$) or nitrogen.

6. The method according to claim 1, wherein said first and second gases contain no molecular hydrogen.

7. The method according to claim 1, wherein a temperature, at which said source gas is heat-processed in said heat processing unit, is 600° C. or more.

8. The method according to claim 7, wherein a temperature, at which said source gas is heat-processed in said heat processing unit, is 700° C. or more.

9. The method according to claim 7, wherein a temperature, at which said source gas is heat-processed in said heat processing unit, is 800° C. or more.

10. The method according to claim 9, wherein a wafer temperature in depositing said first insulator is 750° C. or less.

11. The method according to claim 10, wherein a wafer temperature in depositing said first insulator is 400° C. or more.

12. The method according to claim 1, wherein a pressure of said gas supplied to said film-forming processing unit is in a range of 0.013 kPa or more to 98.8 kPa or less.

13. A method of manufacturing a semiconductor integrated circuit device, comprising the steps of:

(a) introducing, to a plasma processing unit, a source gas containing a first gas having molecular silicon and a second gas having molecular nitrogen, and plasma-processing said source gasp; and (b) supplying, to a film-forming processing unit, a gas containing degradation products of said first and second gases generated in said plasma processing unit, and depositing a first insulator, whose a main component is a silicon nitride, over a main surface of a semiconductor wafer having a first conductive film formed thereon to be a gate electrode, wherein said silicon nitride is a sidewall spacer covering an upper surface of said gate electrode, or an etching stopper film used in forming a contact hole relative to said gate electrode in a self-align manner, and said film-forming processing unit has a cold wall structure of heating said semiconductor wafer to a temperature higher than a temperature of an inner wall of said film-forming processing unit.

14. The method according to claim 13, wherein a concentration of hydrogen contained in said first silicon nitride is $2\times10^{21}$ atoms/cm$^3$ or less.

15. The method according to claim 13, wherein a concentration of hydrogen contained in said first silicon nitride film is $1\times10^{21}$ atoms/cm$^3$ or less.

16. The method according to claim 13, wherein a concentration of hydrogen contained in said first silicon nitride is $0.5\times10^{21}$ atoms/cm$^3$ or less.

17. The method according to claim 13, wherein said first gas contains monosilane (SiH$_4$) or dichlorosilane (SiH$_2$Cl$_2$) and said second gas contains ammonia (NH$_3$) or nitrogen.

18. The method according to claim 13, wherein said first and second gases contain no molecule hydrogen.

19. The method according to claim 13, wherein a wafer temperature in depositing said first insulator is 750° C. or less.

20. A method of manufacturing a semiconductor integrated circuit device, comprising the steps of:

(a) forming a first conductive film over a main surface of a semiconductor wafer;

(b) introducing, to a plasma processing unit of a CVD device, a source gas containing a first gas having molecular silicon and a second gas having molecular nitrogen, and plasma-processing said source gas;

(c) supplying, to a film-forming processing unit of said CVD device, a gas containing degradation products of said first and second gases generated in said plasma processing unit, and depositing a first insulator, whose e main component is silicon nitride, over said first conductive film of said semiconductor wafer, and (d) patterning said first insulator and said first conductive film to form a gate electrode which is formed of said first conductive film and whose an upper surface is covered with said first insulator, wherein said silicon nitride is a sidewall spacer covering an upper surface of a gate electrode, or an etching stopper film used in forming a contact hole relative to said gate electrode in a self-align manner, and said film-forming processing unit has a cold wall structure of heating said semiconductor wafer to a temperature higher than a temperature of an inner wall of said film-forming processing unit.

* * * * *